United States Patent
Yamaguchi et al.

(10) Patent No.: US 8,907,928 B2
(45) Date of Patent: Dec. 9, 2014

(54) IMAGE DISPLAY UNIT AND METHOD OF DETECTING OBJECT

(75) Inventors: Kazunori Yamaguchi, Kanagawa (JP); Hirotoshi Fujisawa, Tokyo (JP); Tsutomu Harada, Tokyo (JP); Mitsuru Tateuchi, Kanagawa (JP)

(73) Assignee: Japan Display West Inc., Aichi-ken (JP)

(*) Notice: Subject to any disclaimer, the term of this patent is extended or adjusted under 35 U.S.C. 154(b) by 1649 days.

(21) Appl. No.: 12/285,168

(22) Filed: Sep. 30, 2008

(65) Prior Publication Data
US 2009/0033638 A1 Feb. 5, 2009

Related U.S. Application Data

(62) Division of application No. 11/402,886, filed on Apr. 13, 2006, now Pat. No. 7,965,266.

(30) Foreign Application Priority Data

Apr. 19, 2005 (JP) ................................. 2005-121215

(51) Int. Cl.
| | |
|---|---|
| G09G 5/00 | (2006.01) |
| G06F 3/042 | (2006.01) |
| G02F 1/1333 | (2006.01) |
| G06F 3/041 | (2006.01) |
| H01L 27/32 | (2006.01) |
| G09G 3/36 | (2006.01) |
| G09G 3/32 | (2006.01) |

(52) U.S. Cl.
CPC .............. *G06F 3/042* (2013.01); *H01L 27/3211* (2013.01); *G02F 1/13338* (2013.01); *H01L 27/322* (2013.01); *G09G 2360/145* (2013.01); *G09G 3/3648* (2013.01); *H01L 27/3225* (2013.01); *G09G 3/3208* (2013.01); *G09G 2300/0452* (2013.01); *G09G 3/3225* (2013.01); *G02F 2203/11* (2013.01); *G09G 2300/0842* (2013.01); *G09G 2310/0256* (2013.01); *G06F 3/0412* (2013.01); *H01L 27/3227* (2013.01)
USPC ............ 345/176; 345/175; 345/156; 345/204

(58) Field of Classification Search
USPC ................................... 345/176, 175, 156, 204
See application file for complete search history.

(56) References Cited

U.S. PATENT DOCUMENTS

| | | | | |
|---|---|---|---|---|
| 6,493,115 | B1 * | 12/2002 | Kanno et al. ................... | 358/538 |
| 7,489,303 | B1 * | 2/2009 | Pryor ............................. | 345/173 |
| 7,598,949 | B2 | 10/2009 | Han | |
| 7,693,330 | B2 * | 4/2010 | So ................................. | 382/174 |

(Continued)

FOREIGN PATENT DOCUMENTS

| | | | |
|---|---|---|---|
| GB | 0215309.6 | * | 7/2002 |
| JP | 07-325319 A | | 12/1995 |

(Continued)

OTHER PUBLICATIONS

Japanese Office Action issued Aug. 30, 2011 for related Japanese Application No. 2008-103187.

*Primary Examiner* — William Boddie
*Assistant Examiner* — Leonid Shapiro
(74) *Attorney, Agent, or Firm* — Rader, Fishman & Grauer PLLC

(57) ABSTRACT

An image display unit and a method of detecting an object which are capable of reliably detecting an object with a simple structure irrespective of use conditions are provided. Invisible light is emitted from a screen of a display portion. The invisible light reflected from a target object which comes in contact with or close to the screen is received on the screen. On the basis of the received invisible light, the target object is detected. Thus, the target object can be reliably detected without influence of the display state of the display portion, and influence of use conditions such as surrounding circumstances (the case where it is bright or dark). Moreover, for example, it is not necessary to separately arrange a component such as a touch panel, so the image display unit can be achieved with a simple structure.

22 Claims, 25 Drawing Sheets

(56) References Cited

U.S. PATENT DOCUMENTS

| | | |
|---|---|---|
| 2002/0175900 A1 | 11/2002 | Armstrong |
| 2003/0142371 A1* | 7/2003 | Hanabusa et al. ............ 358/475 |
| 2004/0113543 A1 | 6/2004 | Daniels |
| 2008/0129707 A1* | 6/2008 | Pryor ............................ 345/175 |

FOREIGN PATENT DOCUMENTS

| | | |
|---|---|---|
| JP | 08-286206 A | 11/1996 |
| JP | 11-119898 A | 4/1999 |
| JP | 2001-077342 A | 3/2001 |
| JP | 2001-109394 A | 4/2001 |
| JP | 2001-175413 A | 6/2001 |
| JP | 2004-045879 A | 2/2004 |
| JP | 2004-102267 A | 4/2004 |
| JP | 2004-318819 A | 11/2004 |
| JP | 2005-275644 A | 10/2005 |
| JP | 2005-293374 A | 10/2005 |
| JP | 2006-508547 A | 3/2006 |

* cited by examiner

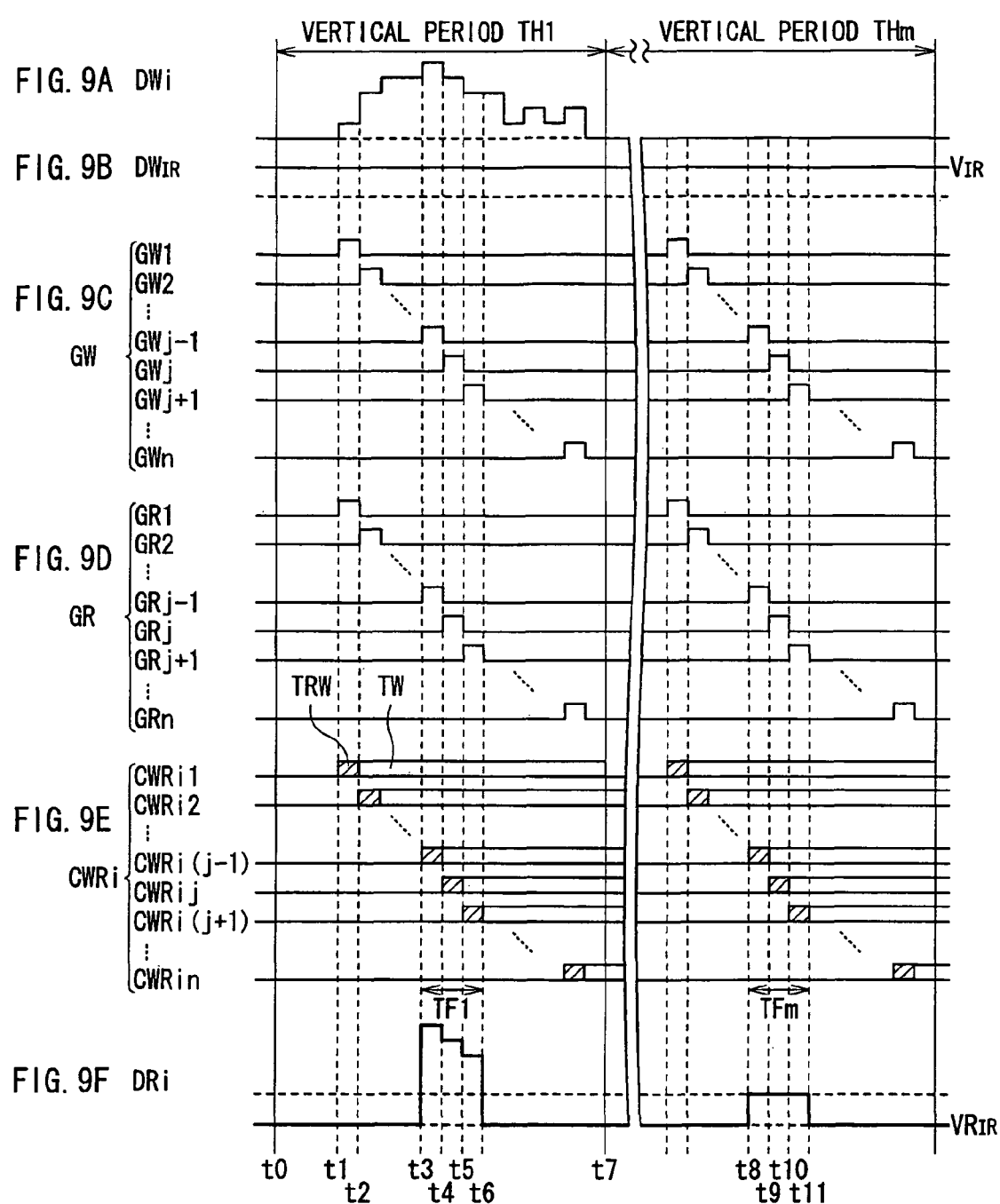

IMAGE DISPLAY UNIT AND METHOD OF DETECTING OBJECT

CROSS REFERENCES TO RELATED APPLICATIONS

The present application is a Continuation Application of the patent application Ser. No. 10/402,886, filed Apr. 13, 2006, which claims priority from Japanese Application No. 2005-121215 filed on Apr. 19, 2005, the entire contents of which are incorporated herein by reference.

BACKGROUND OF THE INVENTION

1. Field of the Invention

The present invention relates to an image display unit having a function of detecting the position or the like of an object which comes in contact with or close to a screen, and a method of detecting an object through the use of such an image display unit.

2. Description of the Related Art

Techniques for detecting the position or the like of an object which comes in contact with or close to a screen of a display unit have been previously known. A typical widespread technique is a display unit including a touch panel.

There are various types of touch panels, and a widespread touch panel is of a type which detects capacitance. When a finger comes in contact with the touch panel of this kind, the touch panel detects a change in surface charge of the panel, thereby the position or the like of an object is detected. Therefore, such a touch panel provides intuitive operation for users.

Recently, there have been proposed various techniques for being able to detect the position or the like of an object without arranging such a touch panel on a screen.

For example, in N. Tada et al. "A Touch Panel Function Integrated LCD Using LTPS Technology", IDW'04 Proceedings of The 11th International Display Workshops, International Display Workshops, p. 349-350, there is disclosed a technique which can capture an image of an object or the like through arranging a light sensor in each pixel in a liquid crystal display unit using low-temperature polysilicon.

SUMMARY OF THE INVENTION

When a liquid crystal display unit described in N. Tada et al. "A Touch Panel Function Integrated LCD Using LTPS Technology", IDW'04 Proceedings of the 11th International Display Workshops, International Display Workshops, p. 349-350 is used, the position or the like of an object can be detected on the basis of a captured image. Therefore, when such a liquid crystal display unit is used, the position or the like of an object can be detected with a simple structure without additionally arranging a component such as a touch panel on a screen.

However, when the image of the object is captured in the liquid crystal display unit, the intensity of received light depends on surrounding environment (brightness). Therefore, it is difficult to detect the position or the like of the object on the basis of the captured image in dark surroundings. It is described in N. Tada et al. "A Touch Panel Function Integrated LCD Using LTPS Technology", IDW'04 Proceedings of The 11th International Display Workshops, International Display Workshops, p. 349-350 that as shown in FIG. 5, for example, when an object such as a finger comes in contact with or close to a screen, and display light is reflected by the object, the position or the like of the object can be detected in dark surroundings through the use of the display light.

However, in the case where display light reflected by the object is used in such a manner, the intensity of the display light becomes an issue. More specifically, the intensity of received light depends on the intensity of the display light, and the intensity of the display light changes depending on image data. Therefore, for example, in the case where the screen is in a so-called black display state, it is still difficult to detect the position or the like of the object on the basis of the captured image.

Thus, in techniques in related arts, it is difficult to reliably detect an object which comes in contact with or close to the screen of the image display unit with a simple structure irrespective of use conditions such as the intensity of display light.

In view of the foregoing, it is desirable to provide an image display unit and a method of detecting an object which are capable of reliably detecting an object with a simple structure irrespective of use conditions.

According to an embodiment of the invention, there is provided an image display unit including a screen, the screen emitting detection light together with display light and detecting the emitted detection light reflected from a target object, the detection light being in an invisible wavelength range, the display light corresponding to image data, wherein the target object is detected on the basis of the detection light.

Herein, "detection light in an invisible wavelength range" means light for object detection having a wavelength in a range except for a visible wavelength range (normally approximately 400 nm to 700 nm). Moreover, "display light" means light in a visible wavelength range which is modulated by image data. Further, "a target object" means an object such as a finger or a pointer which comes in contact with or close to the screen.

According to an embodiment of the invention, there is provided a method of detecting an object, the method being applied to an image display unit which emits display light corresponding to image data from a screen, the method including the steps of: emitting detection light in an invisible wavelength range together with the display light from the screen; detecting emitted detection light reflected from a target object; and detecting the target object on the basis of the detection light.

In the image display unit and the method of detecting an object according to the embodiment of the invention, the display light corresponding to image data and the detection light in an invisible wavelength range are emitted from the screen. At this time, when an object (the target object) comes in contact with or close to the screen, the emitted detection light is reflected from the target object to be detected on the screen. Thus, when the detection light reflected from the target object is detected, the target object is detected on the basis of the detection light. Moreover, the detection light is light in an invisible wavelength range, so the detection light can be detected without influence of use conditions such as display light of which the intensity changes according to image data.

The image display unit according to the embodiment of the invention can include a plurality of first light-emitting devices emitting light in a visible wavelength range; a second light-emitting device emitting light in an invisible wavelength range; a plurality of light-receiving devices receiving light in an invisible wavelength range: a first light emission driving means for driving the plurality of first light-emitting devices on the basis of the image data so as to emit the display light from the screen; a second light emission driving means for driving the second light-emitting device so as to emit the detection light from the screen; a first light reception driving means for driving the plurality of light-receiving devices so as to detect, on the screen, the detection light emitted from the second light-emitting device and reflected from the target object; and a detecting means for detecting the target object on the basis of light reception signals obtained from the light-receiving devices.

In this case, each of the first light-emitting devices and the second light-emitting device can be configured with a liquid crystal device, or can be a self-luminous device such as, for example, an organic EL device. Moreover, the plurality of first light-emitting devices and the plurality of light-receiving devices may be arranged in a matrix form, and the first light emission driving means may drive the plurality of first light-emitting devices so as to perform line-sequential light emission operation, and the first light reception driving means may drive the plurality of light receiving devices so as to perform line-sequential light reception operation.

Herein, "a matrix form" means a state where a plurality of first light-emitting devices and a plurality of light-receiving devices are arranged in a horizontal line direction and a vertical line direction of the screen throughout the screen of the image display unit, and each element arranged in such a manner is called pixel. Moreover, "line-sequential light emission operation" and "line-sequential light reception operation" means operation modes in which the first light-emitting devices and the light-receiving devices included in pixels in one horizontal line perform light emission operation and light reception operation in sequence for each horizontal line, and when they are performed throughout the screen of the image display unit, image data for one screen can be displayed, and pixels in one screen can receive light.

The image display unit according to the embodiment of the invention can include a plurality of third light-emitting devices emitting light in a visible wavelength range; a plurality of light-emitting/receiving devices having a function of emitting light in an invisible wavelength range and a function of receiving light in an invisible wavelength range; a third light emission driving means for driving the plurality of third light-emitting devices on the basis of the image data so as to emit the display light from the screen; a fourth light emission driving means for driving the plurality of light-emitting/receiving devices so as to emit the detection light from the screen; a second light reception driving means for driving the plurality of light-emitting/receiving devices so that one light-emitting/receiving device detects detection light emitted from another light-emitting/receiving device and reflected from the target object on the screen; and a detecting means for detecting the target object on the basis of light reception signals obtained from the one light-emitting/receiving device.

In this case, each of the light-emitting/receiving devices can be an organic EL device. Moreover, the plurality of third light-emitting device and the plurality of light-emitting/receiving devices may be arranged in a matrix form, and the third light emission driving means may drive the plurality of third light-emitting devices so as to perform line-sequential light emission operation, and the second light reception driving means may drive the plurality of light-emitting/receiving devices so as to perform line-sequential light reception operation.

In the image display unit and the method of detecting an object according to the embodiment of the invention, detection light in an invisible wavelength range is emitted from the screen, and the detection light reflected from the target object is detected on the screen, thereby the target object is detected on the basis of the detection light, so an object can be reliably detected without influence of use conditions. Moreover, it is not necessary to separately arrange a component such as a touch panel, so the image display unit can be achieved with a simple structure.

Other and further objects, features and advantages of the invention will appear more fully from the following description.

BRIEF DESCRIPTION OF THE DRAWINGS

FIGS. 9A through 9F are timing charts showing an example of a process of detecting a target object by line-sequential operation;

DETAILED DESCRIPTION OF THE PREFERRED EMBODIMENTS

Best modes for carrying out the invention (hereinafter referred to simply as embodiments) will be described in detail below referring to the accompanying drawings. In the following embodiments, "an invisible wavelength range" is a range (a near-infrared and infrared range) on a longer wavelength side than a visible wavelength range.

[First Embodiment]

Figure 1:
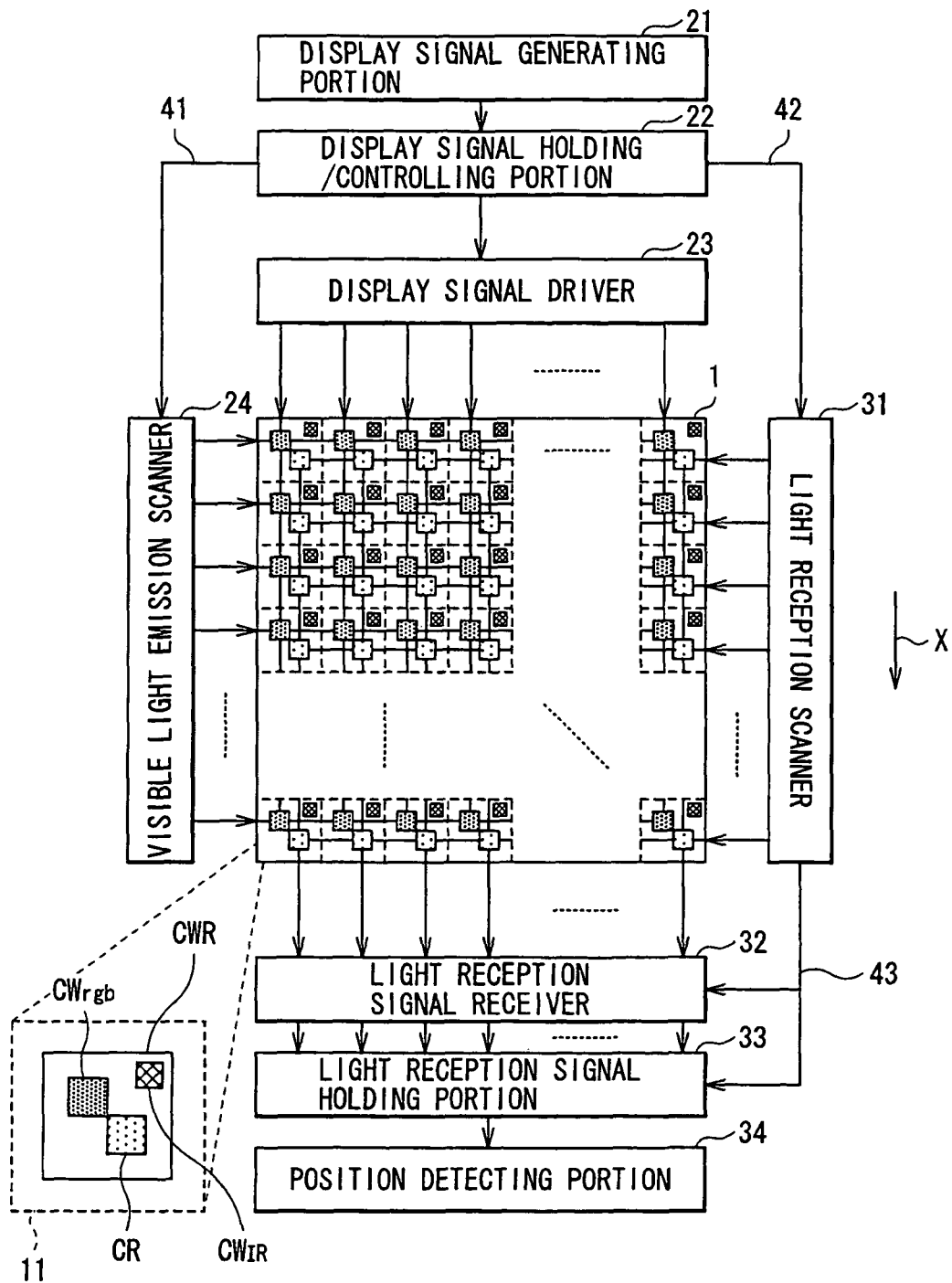
FIG. 1 is a block diagram of the whole structure of an image display unit according to a first embodiment of the invention.

FIG. 1 shows the whole structure of an image display unit according to a first embodiment of the invention. The image display unit includes a display portion 1, a display signal generating portion 21, a display signal holding/controlling portion 22, a display signal driver 23, a visible light emission scanner 24, a light reception scanner 31, a light reception signal receiver 32, a light reception signal holding portion 33 and a position detecting portion 34. The image display unit displays an image on the display portion 1 on the basis of image data, and detects the position of an object (a target object 12 which will be described later) which comes in contact with or close to the display portion 1. A method of detecting an object according to an embodiment of the invention is exemplified by the image display unit according to the embodiment, so the method of detecting an object will be also described below.

The display portion 1 includes a LCD (Liquid Crystal Display) in which a plurality of pixels 11 are arranged on the whole surface of the display portion 1 in a matrix form, and the display portion 1 displays an image such as a predetermined graphic form or character while performing line-sequential operation, as will be described later. Moreover, each pixel 11 includes a light emitting/receiving cell CWR which includes a visible light emitting cell CWrgb emitting visible light, an invisible light emitting cell CWIR emitting invisible light and a light receiving cell CR capable of receiving visible light and invisible light, and as will be described later, each pixel 11 can perform light emission operation and light reception operation. The structure of the display portion 1 will be described in detail later.

The display signal generating portion 21 generates a display signal for displaying, for example, each frame (each field) on the display portion 1 on the basis of image data supplied from, for example, a CPU (Central Processing Unit) or the like (not shown). The display signal generated in such a manner is outputted to the display signal holding/controlling portion 22.

The display signal holding/controlling portion 22 stores and holds the display signal for each frame (each field) outputted from the display signal generating portion 21 in a field memory including, for example, a SRAM (Static Random Access Memory) or the like. The display signal holding/controlling portion 22 also plays a role in controlling the visible light emission scanner 24 and the display signal drivers 23 which drive each visible light emitting cell CWrgb and the light reception scanner 31 which drives each light receiving cell CR so that they operate in conjunction with one another. More specifically, the display signal holding/controlling portion 22 outputs a light emission timing control signal 41 and a light reception timing control signal 42 to the visible light emission scanner 24 and the light reception scanner 31, respectively, and the display signal holding/controlling portion 22 outputs a control signal, and a display signal for one horizontal line based on the display signal for one frame held in the field memory to the display signal driver 23. Thus, the control signals and the display signal are supplied to the visible light emission scanner 24, the light reception scanner 31 and the display signal driver 23 so that, for example, line-sequential operation in an arrow X direction which will be described later is performed.

The visible light emission scanner 24 selects a visible light emitting cell CWrgb to be driven according to the light emission timing control signal 41 outputted from the display signal holding/controlling portion 22. More specifically, the visible light emission scanner 24 supplies a light emission selecting signal to the visible light emitting cell CWrgb to be driven via a light emitting gate line connected to each pixel 11 of the display portion 1 so as to control a light-emitting device selector switch. Thus, when a voltage is applied by the light emission selecting signal to turn on a light-emitting device selector switch of a pixel, the pixel emits light with an intensity corresponding to the voltage supplied from the display signal driver 23.

The display signal driver 23 supplies display data to the visible light emitting cell CWrgb to be driven according to the display signal for one horizontal line outputted from the display signal holding/controlling portion 22. More specifically, the display signal driver 23 supplies a voltage corresponding to the display data to the pixel 11 selected by the visible light emission scanner 24 via a data supply line connected to each pixel 11 of the display portion 1. Thus, when the visible light emission scanner 24 and the display signal driver 23 perform line-sequential operation in conjunction with each other, an image corresponding to arbitrary display data is displayed on the display portion 1.

The light reception scanner 31 selects a light receiving cell CR to be driven according to a light reception timing control signal 42 outputted from the display signal holding/controlling portion 22. More specifically, the light reception scanner 31 supplies a light reception selecting signal to the light receiving cell CR via a light receiving gate line connected to each pixel 11 of the display portion 1 so as to control a light-receiving device selector switch. In other words, as in the case of the above-described visible light emission scanner 24, when a voltage is applied by the light reception selecting signal to turn on the light-receiving device selector switch of a pixel, a light reception signal detected from the pixel is outputted to the light reception signal receiver 32. Thus, visible light and invisible light are received by the light receiving cell CR.

Further, the light reception scanner 31 also has a function of outputting a light reception block control signal 43 to each of the light reception signal receiver 32 and the light reception signal holding portion 33 so as to control the operation of a portion contributing light reception operation in each of the light reception signal receiver 32 and the light reception signal holding portion 33.

The light reception signal receiver 32 obtains a light reception signal for one horizontal line outputted from each light receiving cell CR according to the light reception block control signal 43 outputted from the light reception scanner 31. The light reception signal for one horizontal line obtained in such a manner is outputted to the light reception signal holding portion 33.

The light reception signal holding portion 33 restructures the light reception signal outputted from the light reception signal receiver 32 into a light reception signal for one frame (one field) according to the light reception block control signal 43 outputted from the light reception scanner 31 so as to store and hold the light reception signal for one frame (one field) in a field memory including, for example, a SRAM or the like. The light reception signal stored in the field memory in such a manner is outputted to the position detecting portion 34. The light reception signal holding portion 33 may include a storage device except for a memory, and for example, the light reception signal holding portion 33 may hold the light reception signal as analog data.

The position detecting portion 34 performs a signal process on the basis of the light reception signal outputted from the light reception signal holding portion 33, and specifies the position or the like of an object which comes in contact with or close to the display portion 1 from the position of the light receiving cell CR which detects the light reception signal. Thus, the position or the like of the object which comes in contact with or close to the display portion 1 is specified. As described above, in the case where the light reception signal holding portion 33 holds the light reception signal as analog data, the position detecting portion 34 can have a structure in which a signal process is performed after performing analog-to-digital conversion (A/D conversion).

The display signal driver 23 and the visible light emission scanner 24 correspond to specific examples of "a first light emission driving means" in the invention, and the light reception scanner 31 corresponds to a specific example of "a first light reception driving means" in the invention.

Next, referring to FIGS. 2 through 5, the structure of the display portion 1 and the light emitting/receiving cell CWR will be described in detail below.

Figure 2:
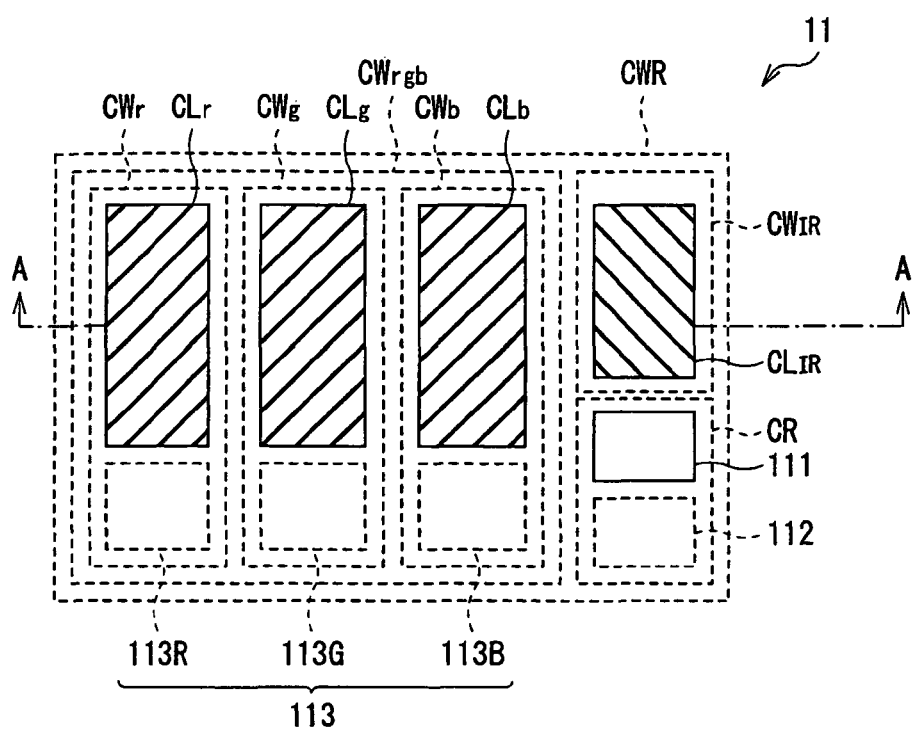
FIG. 2 is a schematic plan view of an example of the structure of a light emitting/receiving cell in FIG. 1.

FIG. 2 shows a plan view of an example of the structure of the light emitting/receiving cell CWR in each pixel 11. As described above, the light emitting/receiving cell CWR includes the visible light emitting cell CWrgb, the invisible light emitting cell CWIR and the light receiving cell CR. The visible light emitting cell CWrgb among them includes a red light emitting cell CWr which emits red light, a green light emitting cell CWg which emits green light and a blue light emitting cell CWb which emits blue light. The red light emitting cell CWr includes a red light-emitting device CLr as a portion which emits red light and a TFT (Thin Film Transistor) circuit portion 113R which includes a switch device (a light-emitting device selector switch SW1R which will be described later) driving the red light-emitting device CLr, and the green light emitting cell CWg includes a green light-emitting device CLg as a portion which emits green light and a TFT circuit portion 113G which includes a switch device (a light-emitting device selector switch SW1G which will be described later) driving the green light-emitting device CLg, and the blue light emitting cell CWb includes a blue light-emitting device CLb as a portion which emits blue light and a TFT circuit portion 113B which includes a switch device (a light-emitting device selector switch SW1B which will be described later) driving the blue light-emitting device CLb. Moreover, the invisible light emitting cell CWIR includes an invisible light-emitting device CLIR as a portion emitting invisible light, and the light receiving cell CR includes a light reception sensor 111 as a portion receiving visible light and invisible light and a light reception sensor circuit portion 112 which includes a switch device (a light-receiving device selector switch SW2 which will be described later) driving the light reception sensor 111. The light reception sensor 111 includes, for example, a photodiode or the like. In the case where invisible light on a longer wavelength side than a visible wavelength range is used as in the case of the embodiment, the light reception sensor 111 is preferably made of monocrystalline silicon rather than amorphous silicon, because when the light reception sensor 111 is made of monocrystalline silicon, the wavelength range of receivable light is expanded (to a wavelength range of approximately 1100 nm or less). The connecting relationship between the red light-emitting device CLr, the green light-emitting device CLg and the blue light-emitting device CLb, and the TFT circuit portion 113, and the connecting relationship between the TFT circuit portion 113, and the above-described display signal driver 23, the visible light emission scanner 24, the light reception scanner 31 and the light reception signal receiver 32 will be described in detail later (referring to FIG. 4).

The red light-emitting device CLr, the green light-emitting device CLg and the blue light-emitting device CLb correspond to specific examples of "first light-emitting devices" in the invention, and the invisible light-emitting device CLIR corresponds to a specific example of "a second light-emitting device" in the invention, and the light reception sensor 111 corresponds to a specific example of "a light-receiving device" in the invention.

Figure 3:
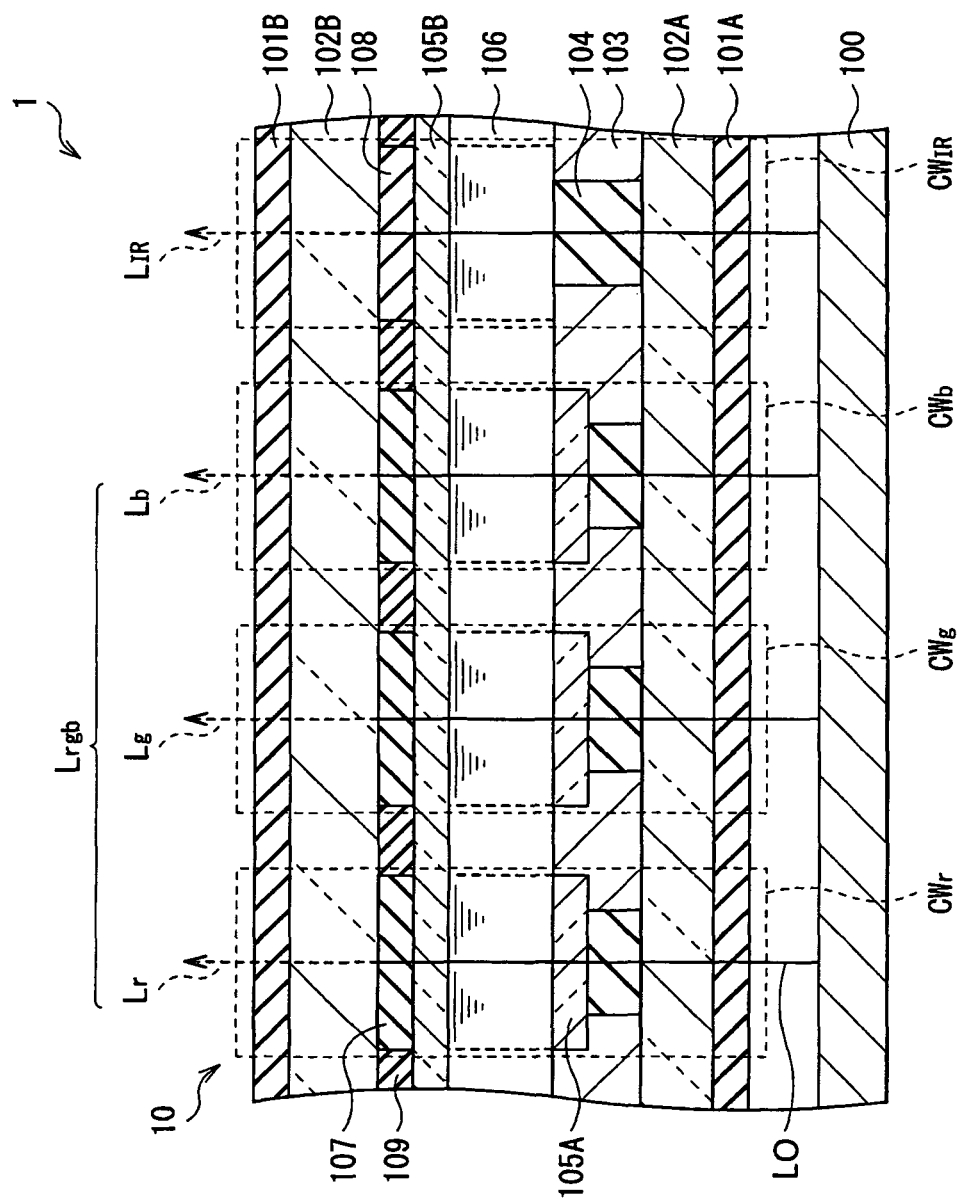
FIG. 3 is a schematic sectional view of an example of the structure of the light emitting/receiving cell in FIG. 1.

FIG. 3 is a sectional view taken along a line A-A of FIG. 2 from the direction of an arrow, and shows an example of a sectional structure of the display portion 1. The display portion 1 has a laminate structure including a light source 100 and each light-emitting device (the red light-emitting device CLr, the green light-emitting device CLg, the blue light-emitting device CLb and the invisible light-emitting device CLIR). More specifically, the laminate structure includes a polarizing plate 101A, a glass substrate 102A, a circuit portion 103, an insulating layer 104, a transparent pixel electrode 105A, a liquid crystal layer 106, a transparent electrode 105B, a color filter 107, a selection filter 108, a black matrix 109, a glass substrate 102B and a polarizing plate 101B in order from the light source 100. In other words, each light-emitting device includes a liquid crystal device, and has a structure in which the liquid crystal layer 106 is disposed between the glass substrates 102A and 102B facing each other.

The light source 100 is a backlight emitting light in visible and invisible wavelength ranges toward the above-described liquid crystal device. The glass substrates 102A and 102B are transparent substrates made of a glass material. However, the glass substrates 102A and 102B may be made of a transparent plastic material instead of the glass material. The glass substrates 102A and 102B correspond to a specific example of "a pair of transparent substrates", and the glass substrate 102B corresponds to a specific example of "a transparent substrate on a side closer to the screen" in the invention.

The circuit portion 103 is a portion corresponding to the TFT circuit portion 113 or the light reception sensor circuit portion 112 which is shown in FIG. 2, and is electrically connected to each transparent pixel electrode 105A. Moreover, the transparent pixel electrode 105A is disposed in each visible light emitting cell CWRrgb, and is made of, for example, a transparent material such as ITO (Indium Tin Oxide). On the other hand, the transparent electrode 105B is a common electrode facing the transparent electrode 105A, and is made of a transparent material such as ITO as in the case of the transparent electrode 105A. Further, the insulating layer 104 is formed between the circuit portions 103. As the display portion 1 has such a structure, a voltage corresponding to display data is applied between the transparent electrodes 105A and 105B, and backlight LO from the light source 100 passes through or is blocked by the liquid crystal layer 106. As shown in FIG. 3, in the invisible light emitting cell CWIR, the transparent pixel electrode 105A is not disposed. As will be described later, only invisible light LIR with a constant intensity is emitted from the invisible light emitting cell CWIR, so it is not necessary to change the intensity according to display data.

The color filter 107 is disposed in a region corresponding to each visible light emitting cell CWrgb (the red light emitting cell CWr, the green light emitting cell CWg and the blue light emitting cell CWb), and selectively allows light in a wavelength range corresponding to its self-luminous color in the backlight LO passing through the liquid crystal layer 106 to pass through. Moreover, the selection filter 108 is disposed in a region corresponding to the invisible light emitting cell CWIR, and selectively allows light in the invisible wavelength range (herein, a range on a longer wavelength side than the visible wavelength range) in the backlight LO having passed through the liquid crystal layer 106 to pass through. The black matrix 109 is disposed between each color filter 107 and the selection filter 108, and blocks the backlight LO from the light source 100 so that the backlight LO is not emitted to the screen 10.

Figure 4:
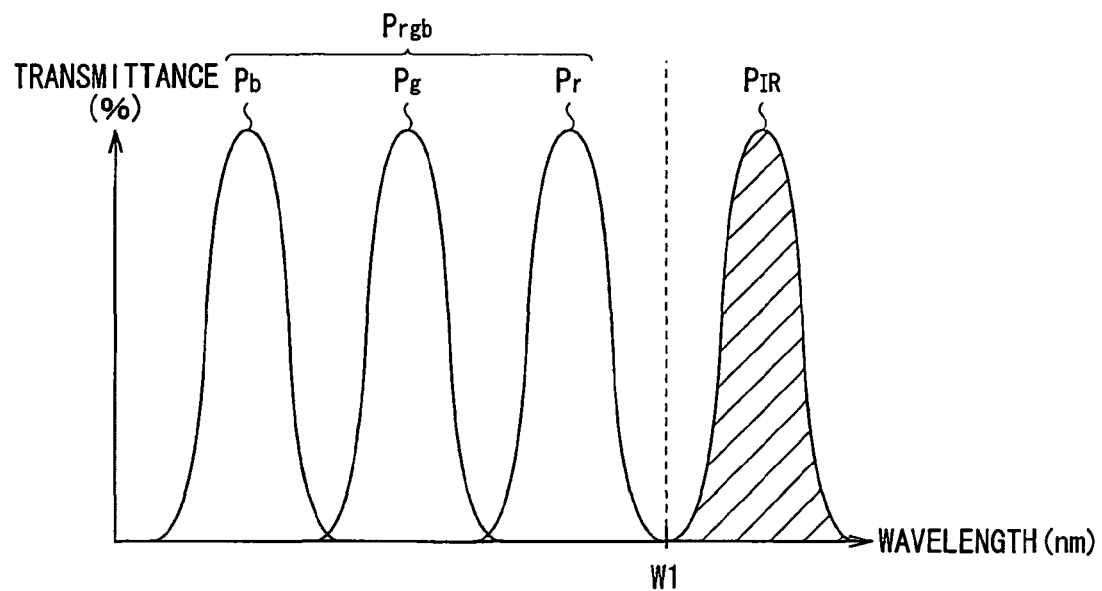
FIG. 4 is a plot showing transmission characteristics of a filter.

Thus, when the backlight LO from the light source 100 passes through the color filter 107 or the selection filter 108, the visible light Lrgb is emitted from the visible light emitting cell CWrgb, that is, the red light Lr, the green light Lg and the blue light Lb are emitted from the red light emitting cell CWr, the green light emitting cell CWg and the blue light emitting cell CWb, respectively, and the invisible light LIR is emitted from the invisible light emitting cell CWIR. Therefore, the emission spectra of the visible light Lrgb and the invisible light LIR are, for example, as shown in FIG. 4. In other words, a visible light emission spectrum Prgb including a red light emission spectrum Pr, a green light emission spectrum Pg and a blue light emission spectrum Pb is observed in a visible wavelength range on a shorter wavelength side than a threshold wavelength W1, and an invisible light emission spectrum PIR is observed in an invisible wavelength range on a longer wavelength side than the threshold wavelength W1. The color filter 107 corresponds to a specific example of "a first selection filter" in the invention, and the selection filter 108 corresponds to a specific example of "a second selection filter" in the invention.

Figure 5:
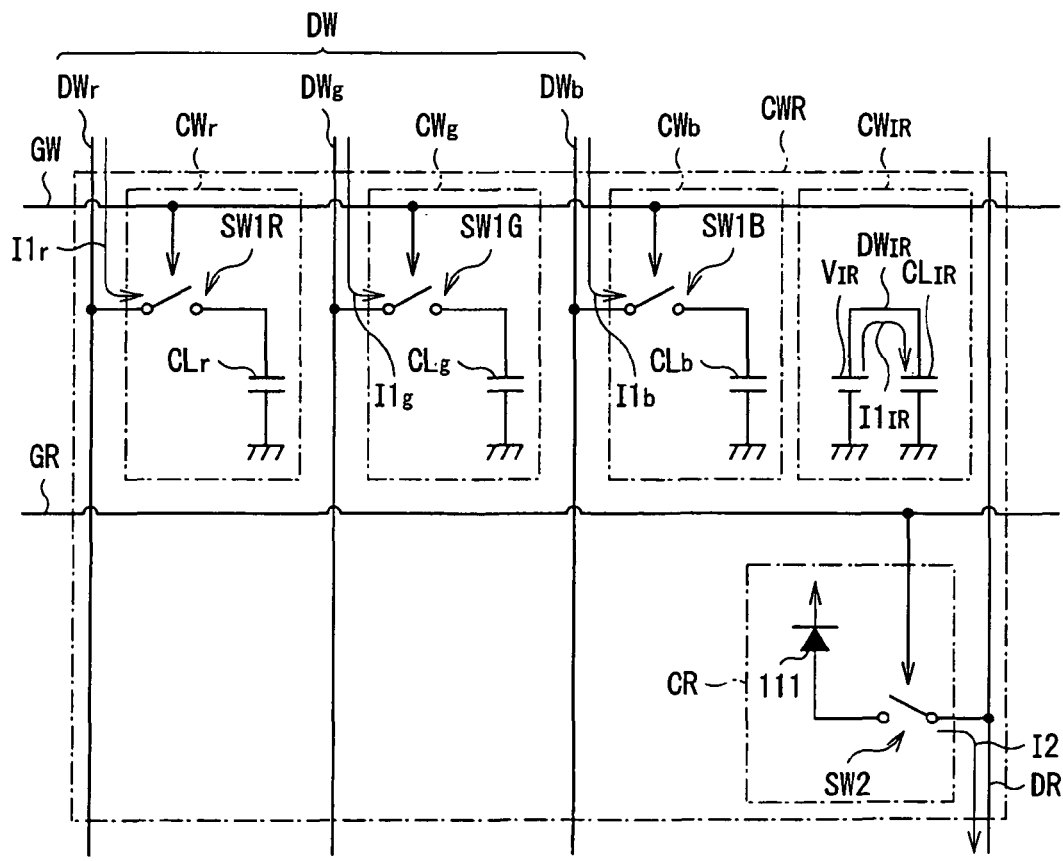
FIG. 5 is a circuit diagram of an example of the structure of the light emitting/receiving cell in FIG. 1.

FIG. 5 shows an example of a circuit structure of the light emitting/receiving cell CWR in each pixel 11. As described above, the light emitting/receiving cell CWR includes the visible light emitting cell CWrgb including the red light emitting cell CWr, the green light emitting cell CWg and the blue light emitting cell CWb, the invisible light emitting cell CWIR and the light receiving cell CR. Among them, the visible light emitting cell CWrgb is connected to a display data supply line DW connected to the display signal driver 23, and a light emitting gate line GW connected to the visible light emission scanner 24. More specifically, a data supply line DWr and the light emitting gate line GW are connected to the red light emitting cell CWr, and a display data supply line DWg and the light emitting gate line GW are connected to the green light emitting cell CWg, and a display data supply line DWb and the light emitting gate line GW are connected to the blue light emitting cell CWb. On the other hand, a light receiving gate line GR connected to the light reception scanner 31, and a data read line DR connected to the light reception signal receiver 32 are connected to the light receiving cell CR, and these connecting lines are not connected to the invisible light emitting cell CWIR. The connecting lines are not connected to the invisible light emitting cell CWIR, because as described above, only the invisible light LIR with a constant intensity is emitted from the invisible light emitting cell CWIR, so it is not necessary to change the intensity according to display data.

The red light emitting cell CWr includes the above-described red light-emitting device CLr and the light-emitting device selector switch SW1R disposed in the above-described TFT circuit portion 113R. The green light emitting cell CWg includes the above-described green light emitting cell CLg and the light-emitting device selector switch SW1G disposed in the above-described TFT circuit portion 113G. The blue light emitting cell CWb includes the above-described blue light-emitting device CLb and the light-emitting device selector switch SW1B disposed in the above-described TFT circuit portion 113B. Moreover, the light receiving cell CR includes the above-described light reception sensor 111 (in the example shown in FIG. 5, a photodiode) as the light-receiving device, and the light-receiving device selector switch SW2 disposed in the above-described light reception sensor circuit portion 112. Further, the invisible light emitting cell CWIR includes the above-described invisible light-emitting device CLIR and a constant-voltage power supply VIR. The light-emitting device selector switches SW1R, SW1G and SW1B each include, for example, a switch device such as a TFT.

The on-off operations of the light-emitting device selector switches SW1R, SW1G and SW1B are controlled by the light emitting gate line GW. Moreover, one end of the light-emitting device selector switch SW1R is connected to the display data supply line DWr, and the other end is connected to one end (more specifically, the above-described transparent pixel electrode 105A) of the red light-emitting device CLr, and the other end (more specifically, the above-described transparent electrode 105B) of the red light-emitting device CLr is grounded. Likewise, one end of the light-emitting device selector switch SW1G is connected to the display data supply line DWg, and the other end is connected to one end of the green light-emitting device CLg, and the other end of the green light-emitting device CLg is grounded. One end of the light-emitting device selector switch SW1B is connected to the display data supply line DWb, and the other end is connected to one end of the blue light-emitting device CLb, and the other end of the blue light-emitting device CLb is grounded. On the other hand, the on-off operation of the light-receiving device selector switch SW2 is controlled by the light receiving gate line GR, and one end of the light-receiving device selector switch SW2 is connected to the data read line DR, and the other end is connected to one end of the light reception sensor 111, and the other end of the light reception sensor 111 is connected to the ground or a positive bias point (not shown). Moreover, one end of the invisible light-emitting device CLIR (more specifically, the circuit portion 103 side in FIG. 3) is connected to the constant-voltage power supply VIR via a data supply line for invisible light emission DWIR, and the other end (more specifically, the above-described transparent electrode 105B) is grounded.

As the light emitting-receiving cell CWR has such a circuit structure, the following light emission operation and light reception operation are performed.

At first, at the time of emitting the visible light Lrgb, the light-emitting device selector switches SW1R, SW1G and SW1B in one horizontal line are turned on according to the light emission selecting signal supplied from the light emitting gate line GW. The red light-emitting device CLr, the green light-emitting device CLg and the blue light-emitting device CLb are charged from the display data supply lines DWr, DWg and DWb via paths I1r, I1g and I1b so as to emit light with an intensity corresponding to each display signal, thereby each light-emitting device emits light with an intensity corresponding to its self-luminous color according to each display signal. On the other hand, at the time of emitting the invisible light LIR, a constant voltage is applied from the constant-voltage power supply VIR to the invisible light-emitting device CLIR via the data supply line for invisible light emission DWIR, so the invisible light-emitting device CLIR is charged by a constant current via a path I1IR, and the invisible light-emitting device CLIR emits the invisible light LIR with a constant intensity.

On the other hand, at the time of receiving light, the light-receiving device selector switches SW2 in one horizontal line are turned on according to the light reception selecting signal supplied from the light receiving gate line GR, and a current corresponding to the amount of light received in the light reception sensor 111 is supplied to the data read line DR via a path 12 so that the visible light Lrgb and the invisible light LIR are received.

When neither of the light emission operation nor the light reception operation is performed, the light-emitting device selector switches SW1R, SW1G and SW1B and the light-receiving device selector switch SW2 are in an off state, and the connection between the display data supply line DWr, DWg and DWb and the red light-emitting device CLr, the green light-emitting device CLg and the blue light-emitting device CLb, and the connection between the data read line DR and the light reception sensor 111 are broken.

Next, a process of detecting an object (a target object) which comes in contact with or close to the screen 10 of the display portion 1 in the image display unit with the above-described structure in a black display state and in a normal display state will be described below.

Figure 6A:
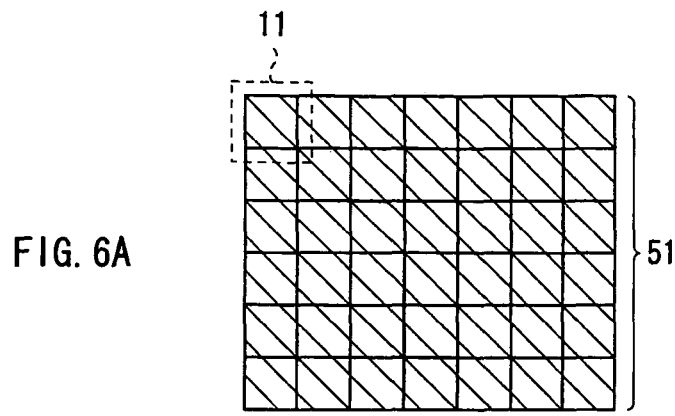
FIGS. 6A, 6B and 6C are schematic views of an example of a process of detecting a target object in a normal display state by line-sequential operation.
Figure 6B:
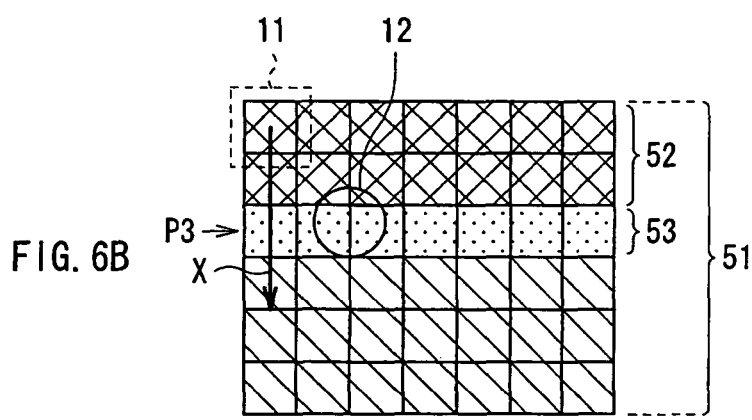
Figure 6C:
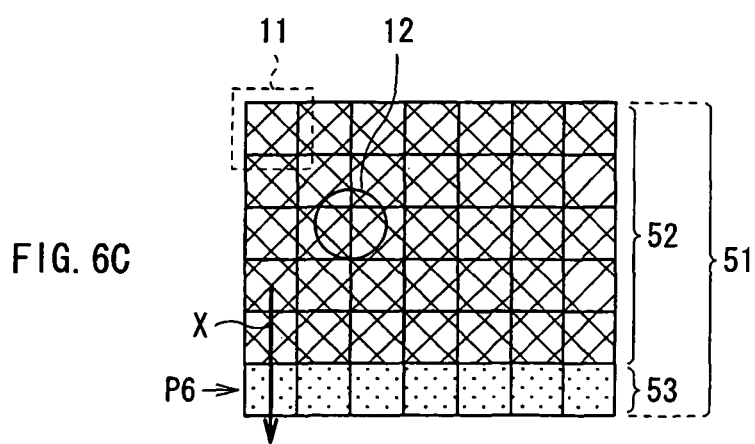
Figure 7:
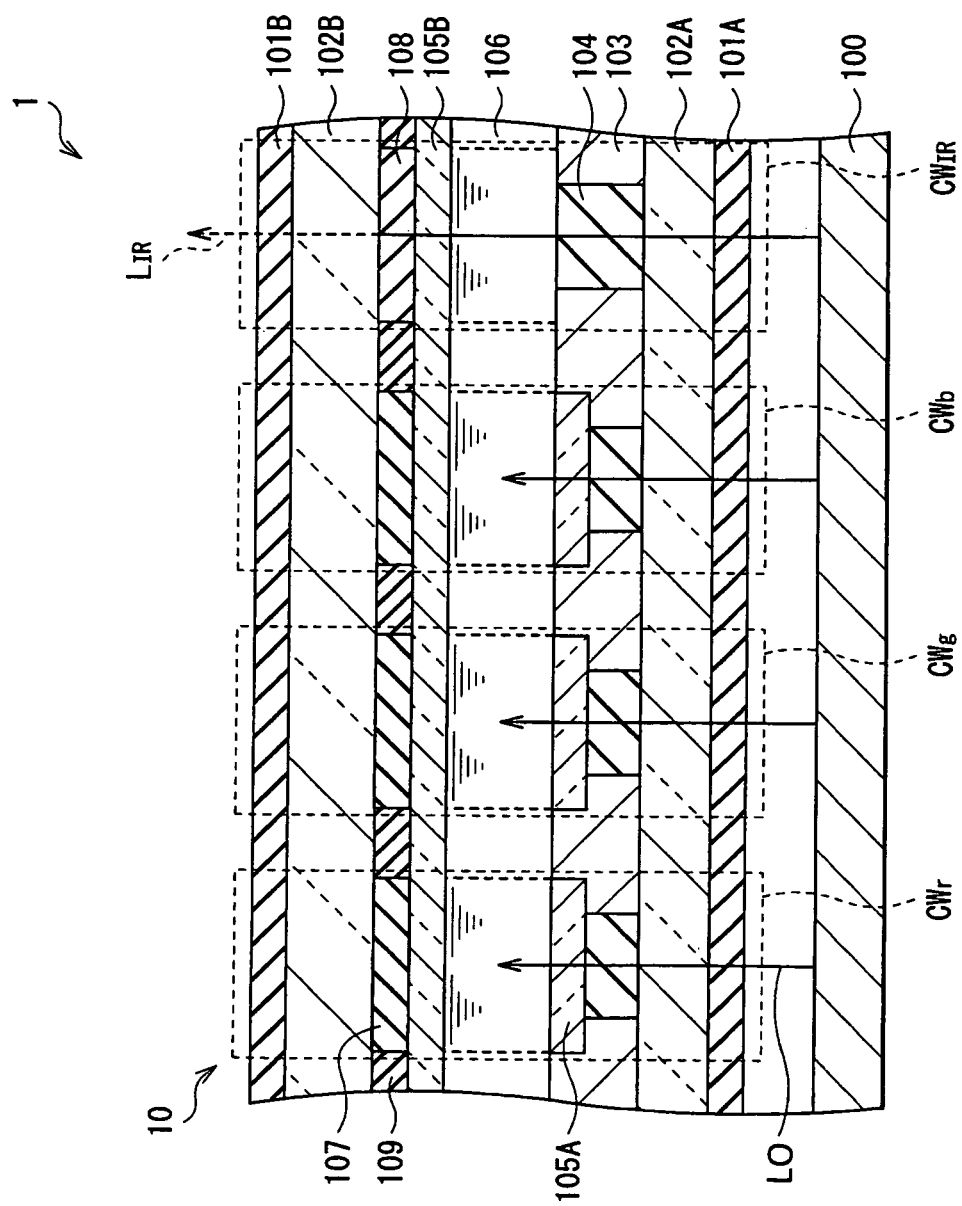
FIG. 7 is a schematic sectional view of an example of the structure of a light emitting/receiving cell in a black display state.
Figure 8A:
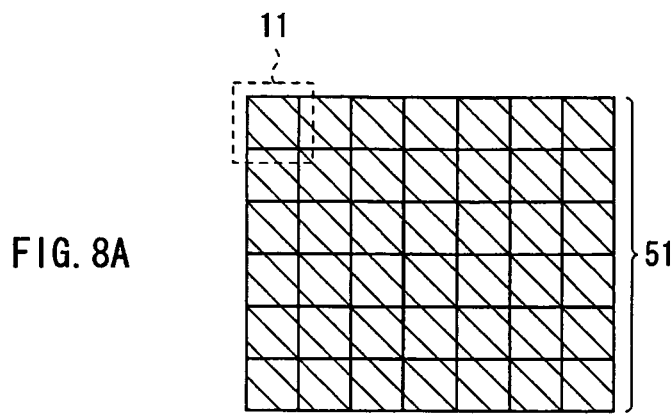
FIGS. 8A, 8B and 8C are schematic views of an example of a process of detecting a target object in a black display state by line-sequential operation.
Figure 8B:
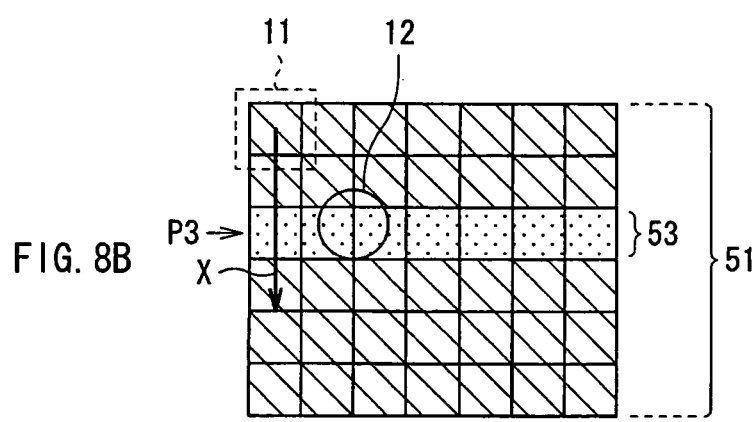
Figure 8C:
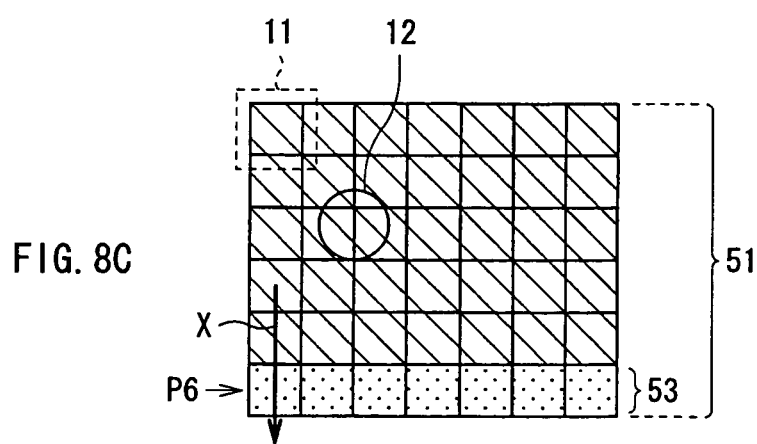

At first, referring to FIGS. 6A through 8C, a process of detecting the target object will be briefly described below. FIGS. 6A, 6B and 6C show an example of a process of detecting the target object by line-sequential operation in a normal display state. FIG. 7 shows a sectional view of the condition of the display portion 1 in a black display state, and FIGS. 8A, 8B and 8C show an example of a process of detecting the target object by line-sequential operation in a black display state. The black display state typically means a state in which visible light Lrgb is not emitted from the pixel 11 of the display portion 1; however, in this description, the black display state means a state in which an image displayed on the display portion 1 is black in all pixels 11. Moreover, one square shown in FIGS. 6A, 6B and 6C and FIGS. 8A, 8B and 8C represents one pixel 11 in the display portion 1.

At first, referring to FIGS. 6A, 6B and 6C, the process in the normal display state will be described below.

As shown in FIG. 6A, the invisible light LIR with a constant intensity is emitted from the invisible light-emitting device CLIR, so each pixel 11 in the display portion 1 is in an invisible light emitting range 51 at all times.

As shown in FIGS. 6B and 6C, when the line-sequential light emission operation of the above-described visible light-emitting devices CLrgb in one horizontal line (in a visible light emitting range 52) and the line-sequential light reception operation of the light reception sensors 111 in one horizontal line (in a light receiving range 53) are performed in sync with each other as shown by an arrow X, the operations enable the display of an image (the emission of the visible light Lrgb) and the reception of the visible light Lrgb and invisible light LIR throughout the display portion 1. Then, for example, when the target object 12 such as a finger comes in contact with or close to the display portion 1, the visible light Lrgb emitted from the visible light emitting range 52 and the invisible light LIR emitted from the invisible light emitting range 51 are reflected from the target object 12. In this case, while light reflected from the target object 12 enters pixels (for example, pixels in a horizontal line indicated by a symbol P3 in FIG. 6B) near the pixel which emits the visible light Lrgb or the invisible light LIR, the light reflected from the target object does not enter pixels (pixels in a horizontal line indicated by a symbol P6 in FIG. 6C) far from the pixel. Therefore, while a light reception signal is detected from a light reception sensor 111 positioned near the target object 12, the light reception signal is not detected in other ranges, so the position where the target object 12 is located can be detected.

Thus, one horizontal line performs the line-sequential light emission operation as well as line-sequential light reception operation to receive reflected light by the emitted visible light Lrgb or the emitted invisible light LIR, thereby the whole display portion 1 becomes a light emitting range as well as a light receiving range, and in addition to displaying image data on the whole display portion 1, whether or not to locate the target object 12 near the display portion 1, and if so, the position of the target object 12 are detected by the light reception signal detected from the light reception sensor 111.

Moreover, in the case of a black display state, as described above, all pixels 11 are in a black display state, so as shown in FIG. 7, the backlight LO emitted from the light source 100 is blocked by the liquid crystal layer 106 in the visible light emitting cells CWr, CWg and CWb. On the other hand, as described above, the invisible light LIR with a constant intensity is emitted from the invisible light emitting cell CWIR, so the backlight LO emitted from the light source 100 passes through the liquid crystal layer 106. Therefore, even in such a black display state, as shown in FIGS. 8A through 8C, when the invisible light LIR emitted from the invisible wavelength range 51 is used, as in the case of the normal display state shown in FIGS. 6A, 6B and 6C, the position of the target object 12 is detected. Thus, the position of the target object is detected without influence of the display state of the display portion 1, that is, a change in intensity according to image data, and influence of use conditions such as surrounding circumstances (the case where it is bright or dark).

Next, referring to FIGS. 9A through 9F, a process of detecting the target object 12 in the image display unit shown in FIG. 1 in the normal display state and in the black display state will be described in detail below. FIGS. 9A through 9F show timing charts of the process of detecting the target object 12 in the image display unit shown in FIG. 1. FIG. 9A shows a display data supply line DWi, FIG. 9B shows the data supply line for invisible light emission DWIR, FIG. 9C shows light emitting gate lines GW (GW1 to GWn) in the 1st to nth horizontal lines, FIG. 9D shows light receiving gate lines GR (GR1 to GRn) in the 1st to nth horizontal lines, FIG. 9E shows light emitting/receiving cells CWRi (CWRi1 to CWRin) for one vertical line in the 1st to nth horizontal lines and FIG. 9F shows a data read line DRi connected to each light emitting/receiving cell CWRi. Moreover, i, j, n and m which represent positions in FIGS. 9A through 9F indicate given natural numbers.

In FIGS. 9A through 9F, a horizontal axis indicates time, and a vertical periods TH1 and THm indicate time taken to scan the whole screen of the display portion 1, that is, time taken for the visible light emission scanner 24 and the light reception scanner 31 to scan from the light emitting gate lines GW1 to GWn and from the light receiving gate lines GR1 to GRn, respectively. Assuming that the target object 12 is located near the light emitting/receiving cells CWRi(j−1), CWRij and CWRi(j+1) in the display portion 1, the light reception signal is detected in a period corresponding to the light emitting/receiving cells CWRi(j−1), CWRij and CWRi(j+1), that is, a period from time t3 to time t6 (a light reception signal detecting period TF1) in the vertical period TH1, and likewise the light reception signal is detected in a light reception signal detecting period TFm in the vertical period THm. On the other hand, a vertical axis indicates voltage at each time of each signal shown in FIGS. 9A through 9D and 9F. The signal from the display data supply line DWi shown in FIG. 9A is display data corresponding to an arbitrary intensity in each pixel 11, and shows a normal display state in the vertical period TH1 and a black display state in the vertical period THm. FIG. 9E shows light emitting/receiving period TRW in which each light emitting/receiving cell CWRi emits the visible light Lrgb and receives the visible light Lrgb and the invisible light LIR and a light emission period TW for the visible light Lrgb.

The process shown in FIGS. 9A through 9F shows an example in which scanning for light emission operation by the visible light emission scanner 24 and scanning for the light reception operation by the light reception scanner 31 are performed at the same time in the same horizontal line in line sequence; however, the scanning for the light emission operation of the visible light Lrgb and scanning for light reception operation can be independently performed. Moreover, a signal from the data read line DRi shown in FIG. 9F is stored in the light reception signal holding portion 33 as analog data; however, as described above, the signal can be stored in the light reception signal holding portion 33 as digital data.

At first, the process in the normal display state (the vertical period TH1) will be described below.

In a period from the times t0 to t1, a selecting signal is not supplied to all light emitting gate lines GW and all light receiving gate lines GR, and the light-emitting device selector switch SW1 and the light-receiving device selector switch SW2 in each light emitting/receiving cell CWRi are turned off. Therefore, the connection between the display data supply lines DWr, DWg and DWb, and the red light-emitting device CLr, the green light-emitting device CLg or the blue light-emitting device CLb, and the connection between the data read line DR and the light reception sensor 111 are broken, thereby each light emitting/receiving cell CWRi is turned into a nonoperating state. On the other hand, a constant voltage is applied to the data line for visible light emission at all times, thereby the invisible light LIR with a constant intensity is emitted.

Next, in a period from the times t1 to t2, the light emission selecting signal and the light reception selecting signal are supplied to the light emitting gate line GW1 and the light receiving gate line GR1, and the light-emitting device selector switches SW1 and light-receiving device selector switches SW2 in the light emitting/receiving cells CWR11, CWR21, ..., CWRm1 connected to the gate lines are turned on simultaneously. Moreover, at this time, as shown in the light emitting/receiving period TRW in FIGS. 9A through 9F, in each light emitting/receiving cell CWRi, each of the visible light-emitting devices CLr, CLg and CLb emits light with an intensity corresponding to the signal from the display data supply line DWi, and a current corresponding to the amount of light received in the light reception sensor 111 is supplied to the data read line so as to perform the light reception operation. In the period (from the times t1 to t2), the light reception signal by the target object is not detected, so an output signal is not outputted from the data read line DRi.

Moreover, at the time t2 or later, the light emission operation and the light reception operation are performed on the light emitting gate line GW2 and the light receiving gate line GR2, the light emitting gate line GW3 and the light receiving gate line GR3, ... in line sequence in the same manner; however, the light reception signal by the target object 12 is not detected, so the output signal is not outputted from the data read line DRi. After the light emitting/receiving period TRW is completed, each light emitting/receiving cell CWRi has a light emission period TW for a predetermined period.

In a period from the times t3 to t6 (a light reception signal detection period TF1), when reflected light from the target object 12 is received in each of the light emitting/receiving cells CWRi(j−1), CWRij and CWRi(j+1), a current corresponding to the amount of received light is converted into a voltage, and the voltage is outputted to the data read line DRi. In this case, each of the light emitting/receiving cells CWRi (j−1), CWRij and CWRi(j+1) receives reflected light based on its light emission operation and reflected light by light emitted from the invisible light emitting cell CWIR, so a signal outputted to the data read line DRi has a value corresponding to signals in the display data supply line DWi and the data supply line for invisible light emission DWIR.

In a period from the times t6 to t7, as in the case of a period from the times t1 to t3, the light emission operation and the light reception operation are performed on the light emitting gate line GWj+2 and the light receiving gate line GRj+2, the light emitting gate line GWj+3 and the light receiving gate line GRj+3, ..., and the light emitting gate line GWn and the light receiving gate line GRn in line sequence; however, the light reception signal by the target object 12 is not detected, so the output signal is not outputted from the data read line DRi.

Thus, in the vertical period TH1, the presence of the target object 12 can be detected in a position near the light emitting/receiving cells CWRi(j−1), CWRij and CWRi(j+1).

On the other hand, in the case of the black display state (the vertical period THm), basically the same operations as those in the normal display state (the vertical period TH1) are performed. More specifically, in each light emitting/receiving cell CWRi, each of the visible light-emitting devices CLr, CLg and CLb performs the light emission operation, and a current corresponding to the amount of light received in the light reception sensor 111 is supplied to the data read line DRi so that the light reception operation is performed. However, in the black display state, the intensity corresponding to the signal from the display data supply line DWi is almost 0, so in the light reception sensor 111, only reflected light by the light emitted from the invisible light emitting cell CWIR is received. In other words, each of the light emitting/receiving cells CWRi(j−1), CWRij and CWRi(j+1) receives only the reflected light by the light emitted from the invisible light emitting cell CWIR, so the signal outputted to the data read line DRi has a value corresponding to a signal in the data supply line for invisible light emission DWIR. Thus, also in the vertical period THm of the black display state, the output signal is outputted from the data read line DRi in the light reception signal detection period TFm, so the presence of the target object 12 is detected in a position near the light emitting/receiving cells CWRi(j−1), CWRij and CWRi(j+1).

As described above, in the embodiment, the invisible light LIR is emitted from the screen 10 of the display portion 1, and the invisible light LIR reflected from the target object 12 which comes in contact with or close to the screen 10 is received on the screen 10 so that the target object 12 is detected on the basis of the received invisible light LIR. Therefore, the target object 12 can be reliably detected without influence of a change in intensity according to the display state of the display portion 1, that is, image data, or influence of use conditions such as surrounding circumstances (the case where it is bright or dark).

Moreover, it is not necessary to additionally arrange a component such as, for example, a touch panel to detect the position or the like of the target object 12, so the image display unit can be achieved with a simple structure.

Further, the light reception sensor 111 in the light receiving cell CR receives not only the invisible light LIR but also the visible light Lrgb, so in addition to a process of detecting an object described in the embodiment, for example, a process of capturing an image can be performed, so the image display unit can be used as, for example, a scanner.

Moreover, as the light source 100 capable of emitting visible light and invisible light, the color filter 107 and the selection filter 108 are combined, visible light Lrgb and the invisible light LIR can be separately emitted from each of the visible light emitting cells CWr, CWg and CWb and the invisible light emitting cell CWIR, respectively. In addition, instead of the light source 100 capable of emitting visible light and invisible light in such a manner, a light source (a first light source) capable of emitting visible light and a light source (a second light source) capable of emitting invisible light may be separately arranged.

As the invisible light LIR with a constant intensity is emitted from the invisible light emitting cell CWIR, a selector switch such as the selector switch disposed in each of the visible light emitting cells CWr, CWg and CWb and the light receiving cell CR is not necessary in the invisible light emitting cell CWIR, so the structure of the light emitting/receiving cell CWR can be simplified.

Figure 10:
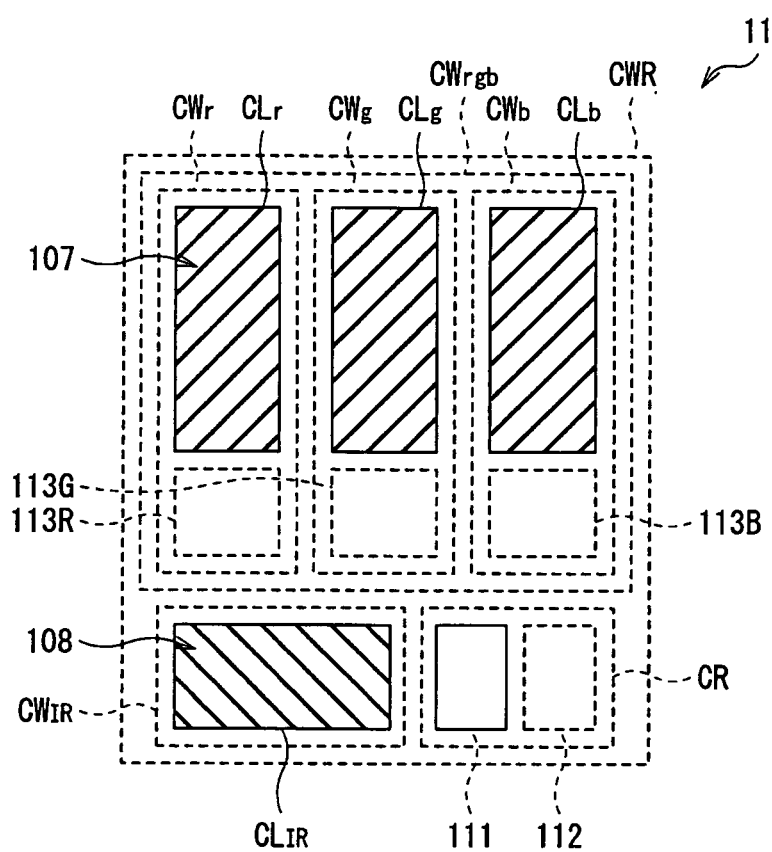
FIG. 10 is a schematic plan view of another example of the structure of the light emitting/receiving cell in FIG. 1.

In the embodiment, as shown in FIG. 2, the case where the visible light emitting cells CWr, CWg and CWb, and the invisible light emitting cell CWIR and the light receiving cell CR are arranged in parallel in the pixel 11 is described; however, for example, as shown in FIG. 10, the invisible light emitting cell CWIR and the light receiving cell CR may be arranged above or below each of the visible light emitting cells CWr, CWg and CWb in the pixel 11.

Figure 11A:
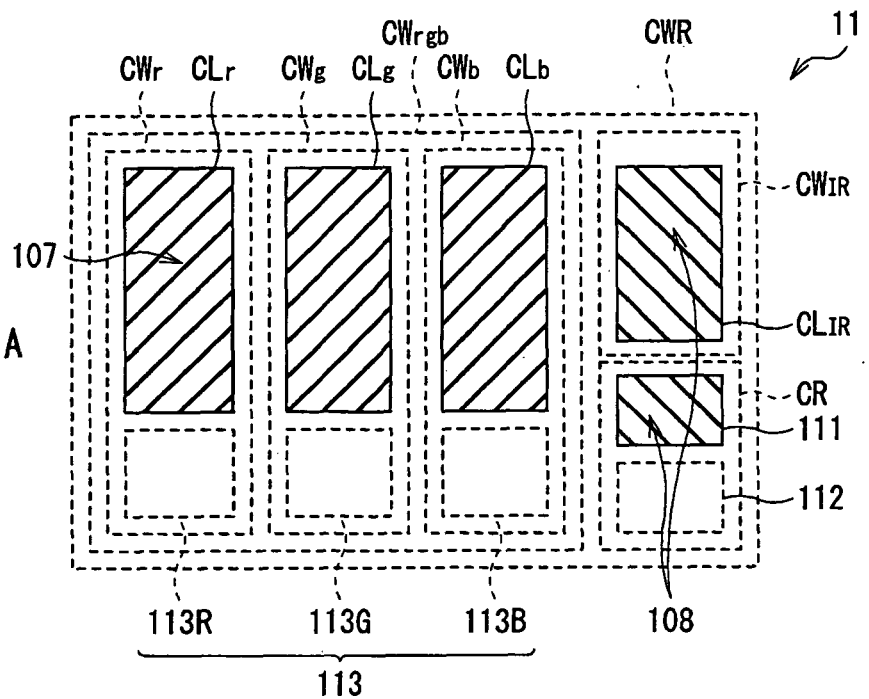
FIGS. 11A and 11B are schematic plan views of another example of the structure of the light emitting/receiving cell in FIG. 1.
Figure 11B:
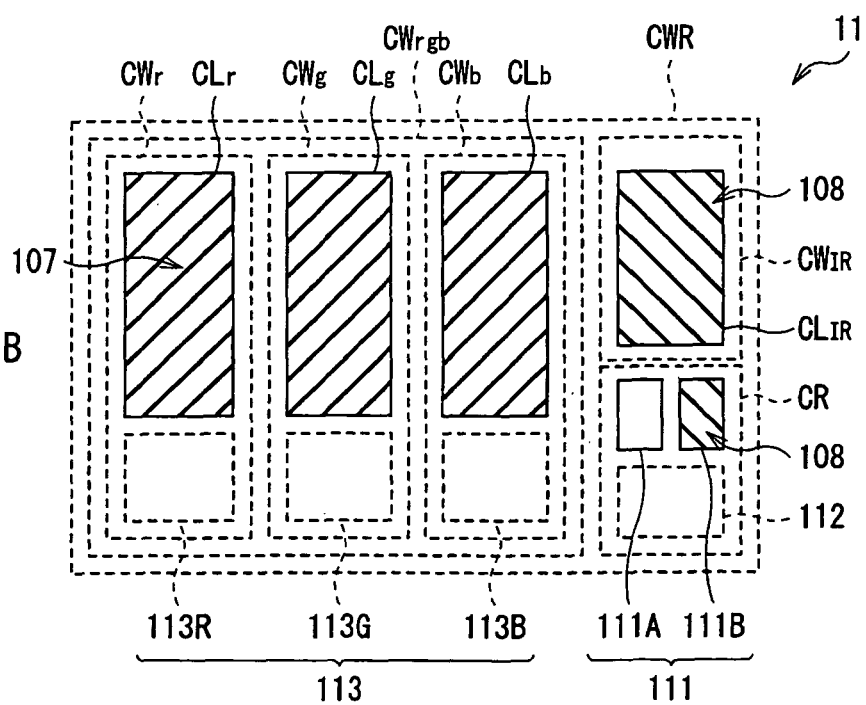

In the embodiment, the case where the selection filter 108 is disposed only in a region corresponding to the invisible light emitting cell CWIR, and the light reception sensor 111 receives the invisible light LIR and the visible light Lrgb is described as an example; however, for example, as shown in FIG. 11A, the selection filter 108 may be also disposed in a region corresponding to the light reception sensor 111 so as to receive only the invisible light LIR. In such a structure, the influence of the visible light Lrgb can be removed, so the target object 12 can be more reliably detected. Moreover, for example, as shown in FIG. 11B, a plurality of light reception sensors (in this case, two light reception sensors) may be disposed in the light receiving cell CR. One of the light reception sensors is a light reception sensor 111A receiving both of the invisible light LIR and the visible light Lrgb and the other is a light reception sensor 111B receiving only the invisible light LIR, thereby the light emission sensors 111A and 111B may be selectively driven to receive light. In such a structure, switching between a process of detecting the target object 12 described in the embodiment and the above-described process of capturing an image can be freely done. Further, a filter which selectively allows only the visible light Lrgb to pass through may be disposed on the light reception sensor 111A so that the light reception sensor 111A receives only the visible light Lrgb. In this case, the light emission sensor 111A corresponds to a specific example of "a first light-receiving device" in the invention, and the light reception sensor 111B corresponds to a specific example of "a second light-receiving device" in the invention.

Figure 12:
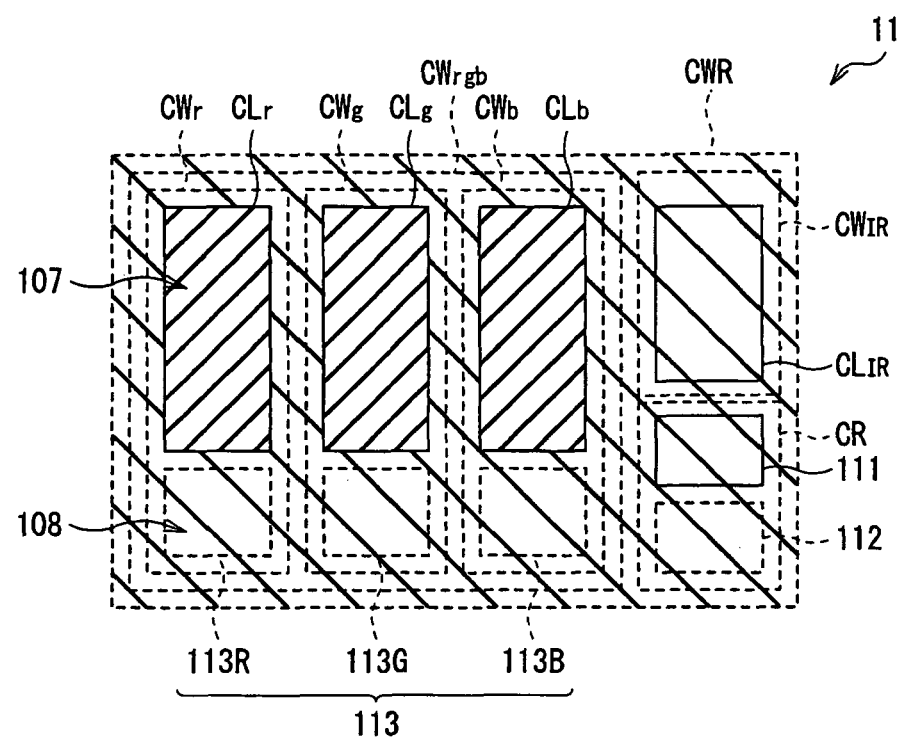
FIG. 12 is a schematic plan view of another example of the structure of the light emitting/receiving cell in FIG. 1.

For example, as shown in FIG. 12, the selection filter 108 which selectively allows only the invisible light LIR to pass through may be disposed in all regions except for a region corresponding to each of the visible light emitting cells CWr, CWg and CWb in each pixel 11. In such a structure, the visible light Lrgb is emitted only from the region corresponding to each of the visible light emitting cells CWr, CWg and CWb, so the selection filter 108 can have a function as the black matrix 109 shown in FIG. 3. Therefore, in the laminate structure of the display portion 1 shown in FIG. 3, the number of layers can be reduced by one, so the manufacturing processes can be simplified, and manufacturing costs can be reduced.

The light reception scanner 31 may be driven to scan every two or three lines, while the visible light emission scanner 24 is driven to scan every line. In such a structure, in addition to the effects in the embodiment, a light reception circuit (a light reception scanner 31, the light reception signal receiver 32 and the light reception signal holding portion 33) can be simplified through reducing the data amount of the light reception signal, and the power consumption can be reduced. Therefore, the structure is effective specifically in the case where the simplification of the circuit structure and lower power consumption is more important than the accuracy of the detected position of an object which comes in contact or close.

Moreover, a plurality of light receiving cells CR may receive light emitted from a plurality of visible light emitting cells CWr, CWg and CWb, and light reception signals from the light receiving cells CR may be combined, into one light reception signal to output the light reception signal. In such a structure, in addition to the effects in the first embodiment, a light reception circuit (the light reception scanner 31, the light reception signal receiver 32 and the light reception signal holding portion 33) can be simplified through reducing the data amount of the light reception signal, and the power consumption can be reduced. Also in such a case, a plurality of light reception signals are combined in one light reception signal, and the light reception signal is outputted to the light reception signal receiver 32, so an S/N ratio and the detecting sensitivity can be improved through increasing the output signal amount.

The number of the light receiving cells CR for the visible light emitting cells CWr, CWg and CWb may be reduced. In such a structure, in addition to the effects in the first embodiment, the light reception circuit (a light reception scanner 31, a light reception signal receiver 32 and a light reception signal holding portion 33) can be simplified through reducing the data amount of the light reception signal, and the power consumption can be reduced. On the contrary, a plurality of light receiving cells CR may be disposed for each of the visible light emitting cells CWr, CWg and CWb. In such a structure, in addition to the effects in the first embodiment, the position of an object which comes in contact or close can be more accurately detected.

[Second Embodiment]

Next, a second embodiment of the invention will be described below.

In the first embodiment, the case where each light-emitting device (the red light-emitting device CLr, the green light-emitting device CLg, the blue light-emitting device CLb and the invisible light-emitting device CLIR) includes a liquid crystal device is described; however, in the embodiment, the case where each light-emitting device includes an organic EL (electroluminescence) device which is a self-luminous device will be described below.

Figure 13:
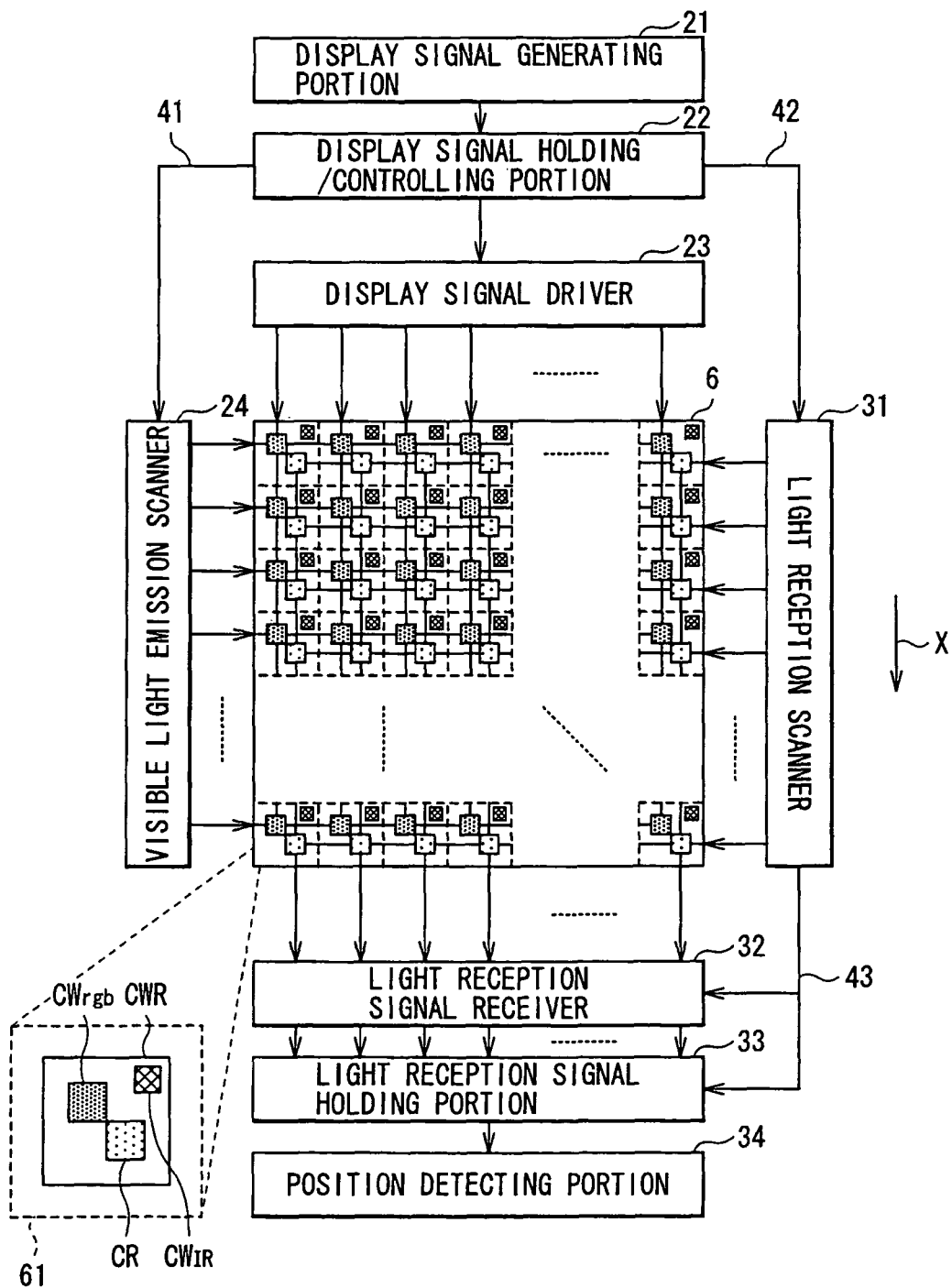
FIG. 13 is a block diagram of the whole structure of an image display unit according to a second embodiment of the invention.

FIG. 13 shows the whole structure of an image display unit according to the embodiment. In the drawing, like components are denoted by like numerals as of the image display unit according to the first embodiment shown in FIG. 1, and will not be further described. The image display unit includes a display portion 6 instead of the display portion 1 according to the first embodiment shown in FIG. 1.

As in the case of the display portion 1, in the display portion 6, a plurality of pixels 61 are arranged on the whole surface of the display portion 6 in a matrix form, and the display portion 6 displays an image such as a predetermined graphic form or character while performing line-sequential operation. Moreover, as in the case of the pixel 11, each pixel 61 includes a light emitting/receiving cell CWR which includes a visible light emitting cell CWrgb emitting visible light, an invisible light emitting cell CWIR emitting invisible light and a light receiving cell CR capable of receiving visible light and invisible light. The display portion 6 is distinguished from the display portion 1 by the fact that as described above, each of the light-emitting devices (the red light-emitting device CLr, the green light-emitting device CLg, the blue light-emitting device CLb and the invisible light-emitting device CLIR) includes an organic EL device.

Figure 14:
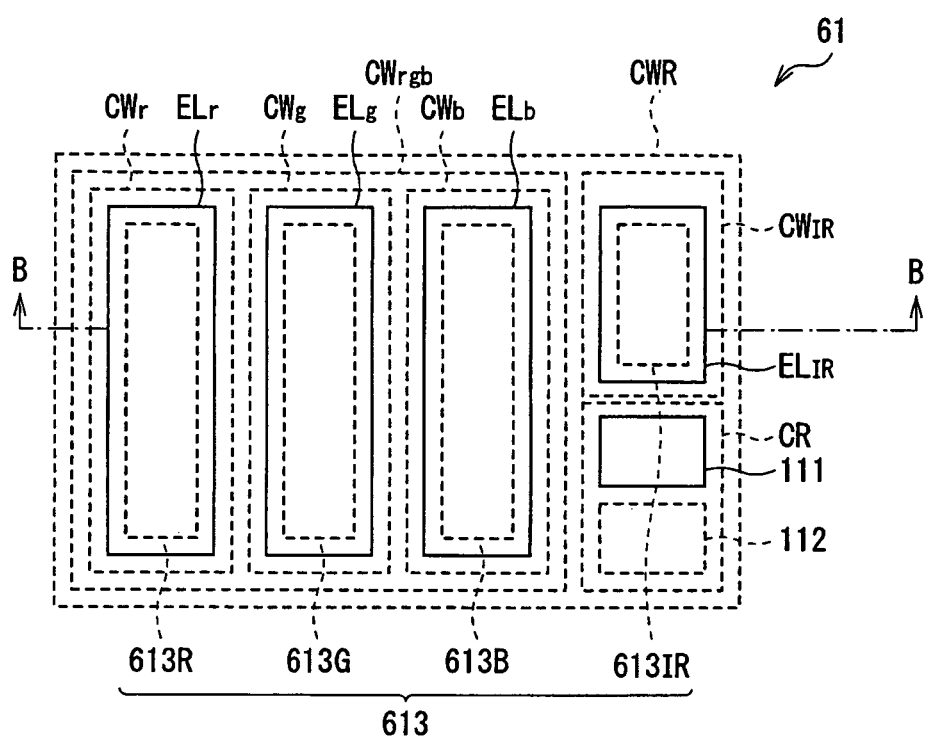
FIG. 14 is a schematic plan view of an example of the structure of a light emitting/receiving cell in FIG. 13.

FIG. 14 shows a plan view of an example of the structure of the light emitting/receiving cell CWR in each pixel 61, and corresponds to FIG. 2 in the first embodiment. The light emitting/receiving cell CWR in the embodiment includes a visible light emitting cell CWrgb, an invisible light emitting cell CWIR and a light receiving cell CR as described above. Moreover, the visible light emitting cell CWrgb among them includes a red light emitting cell CWr emitting red light, a green light emitting cell CWg emitting green light and a blue light emitting cell CWb emitting blue light. Further, the red light emitting cell CWr includes a red light-emitting device ELr which is a portion emitting red light and a TFT circuit portion 613R which includes a switch device (a light-emitting device selector switch SW3R which will be described later) driving the red light-emitting device ELr, and the green light emitting cell CWg includes a green light-emitting device ELg which is a portion emitting green light and a TFT circuit portion 613G which includes a switch device (a light-emitting device selector switch SW3G which will be described later) driving the green light-emitting device ELg, and the blue light emitting cell CWb includes a blue light-emitting device ELb which is a portion emitting blue light and a TFT circuit portion 613B which includes a switch device (a light-emitting device selector switch SW3B which will be described later) driving the blue light-emitting device ELb. Moreover, the invisible light emitting cell CWIR includes an invisible light-emitting device ELIR which is a portion emitting invisible light and a TFT circuit portion 613IR which includes a capacity device (a capacitor CIR which will be described later) supplying a charge to the invisible light-emitting device ELIR, and the light receiving cell CR includes a light reception sensor 111 and a light reception sensor circuit portion 112 which includes a light-receiving device selector switch SW2 driving the light reception sensor 111. The red light-emitting device ELr, the green light-emitting device ELg and the blue light-emitting device ELb correspond to specific examples of "a red light emitting organic EL device", "a green light emitting organic EL device" and "a blue light emitting organic EL device" in the invention, respectively. Moreover, the invisible light-emitting device ELIR corresponds to a specific example of "an invisible light emitting organic EL device" in the invention.

Figure 15:
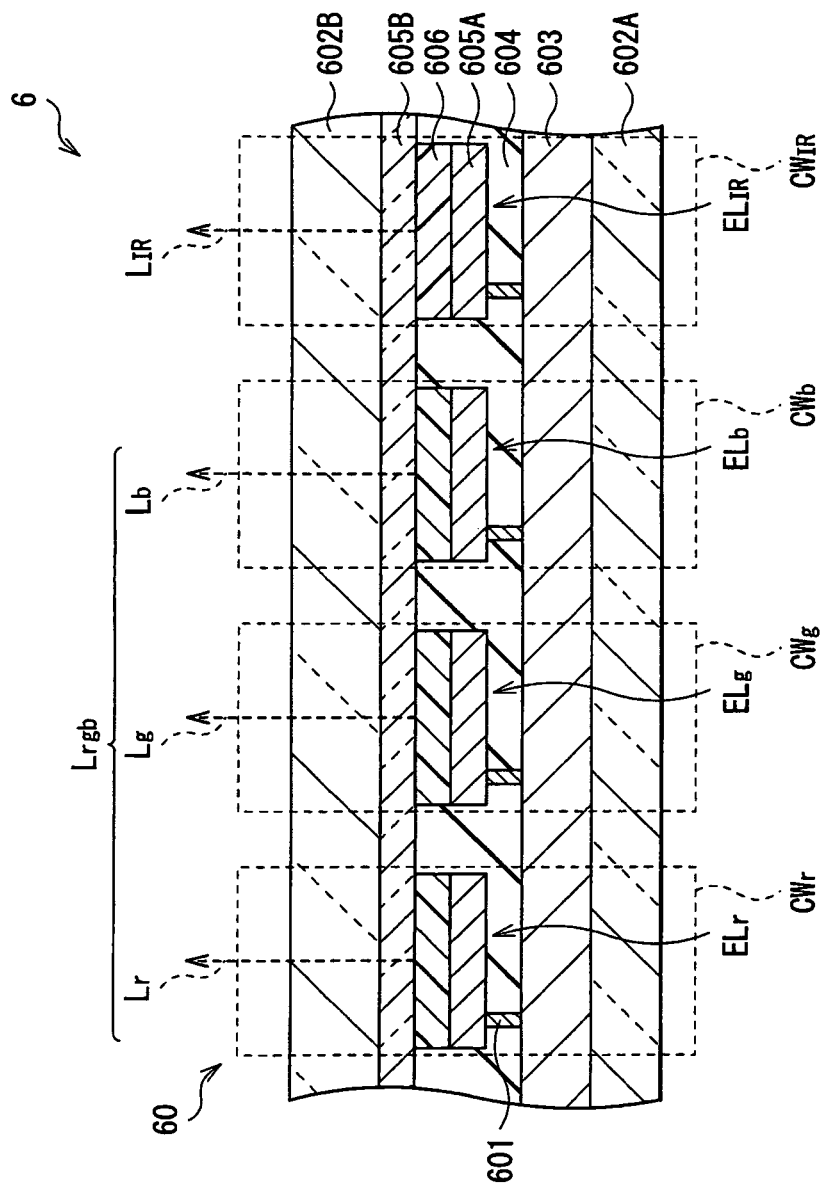
FIG. 15 is a schematic sectional view of an example of the structure of the light emitting/receiving cell in FIG. 13.

FIG. 15 is a sectional view taken along a line B-B of FIG. 14 from an arrow direction, and shows an example of a sectional structure of the display portion 6. FIG. 15 corresponds to FIG. 3 in the first embodiment. The display portion 6 has a laminate structure including each of the light-emitting devices (the red light-emitting device ELr, the green light-emitting device ELg, the blue light-emitting device ELb and the invisible light-emitting device ELIR). More specifically, the laminate structure includes a glass substrate 602A, a circuit portion 603, a contact portion 601, an insulating layer 604, a pixel electrode 605A, an organic layer 606, a transparent electrode 605B and a glass substrate 602B. In other words, each of the light-emitting devices includes an organic EL device as described above, and has a structure in which the organic layer 606 is disposed between the glass substrates 602A and 602B facing each other.

As in the case of the glass substrates 102A and 102B, the glass substrates 602A and 602B are transparent substrates made of a glass material. However, instead of the glass material, the glass substrates 602A and 602B may be made of a transparent plastic material. The glass substrates 602A and 602B correspond to a specific example of "a pair of substrates" in the invention, and the glass substrate 602B corresponds to a specific example of "a substrate on a side closer to the screen" in the invention.

The circuit portion 603 is a portion corresponding to the TFT circuit portion 613 and the light reception sensor circuit portion 112 shown in FIG. 14, and is electrically connected to each pixel electrode 605A via the contact portion 601. The pixel electrode 605A is disposed in each visible light emitting cell CWRgb. On the other hand, the transparent electrode 605B is a common electrode facing the transparent electrode 605A, and is made of, for example, a transparent material such as ITO.

The organic layer 606 is made of a predetermined organic material, and when a voltage corresponding to display data is applied between the pixel electrode 605A and the transparent electrode 605B, the organic layer 606 emits light with a predetermined wavelength range corresponding to the composition of the material with an intensity corresponding to the applied voltage. More specifically, while the organic layer 606 in the visible light emitting cell CWRr, the organic layer 606 in the visible light emitting cell CWRg and the organic layer 606 in the visible light emitting cell CWRb emit red light Lr, green light Lg and blue light Lb, respectively, the organic layer 606 in the invisible light emitting cell CWIR emits invisible light LIR. The organic layer 606 in the invisible light emitting cell CWIR can be made of a charge transfer complex of a porphyrin-fullerene film or the like. The organic layer 606 in each of the visible light emitting cells CWRgb corresponds to a specific example of "a light emission layer" in the invention, and the organic layer 606 in the invisible light emitting cell CWRIR corresponds to a specific example of "an invisible light emission layer" in the invention.

Figure 16:
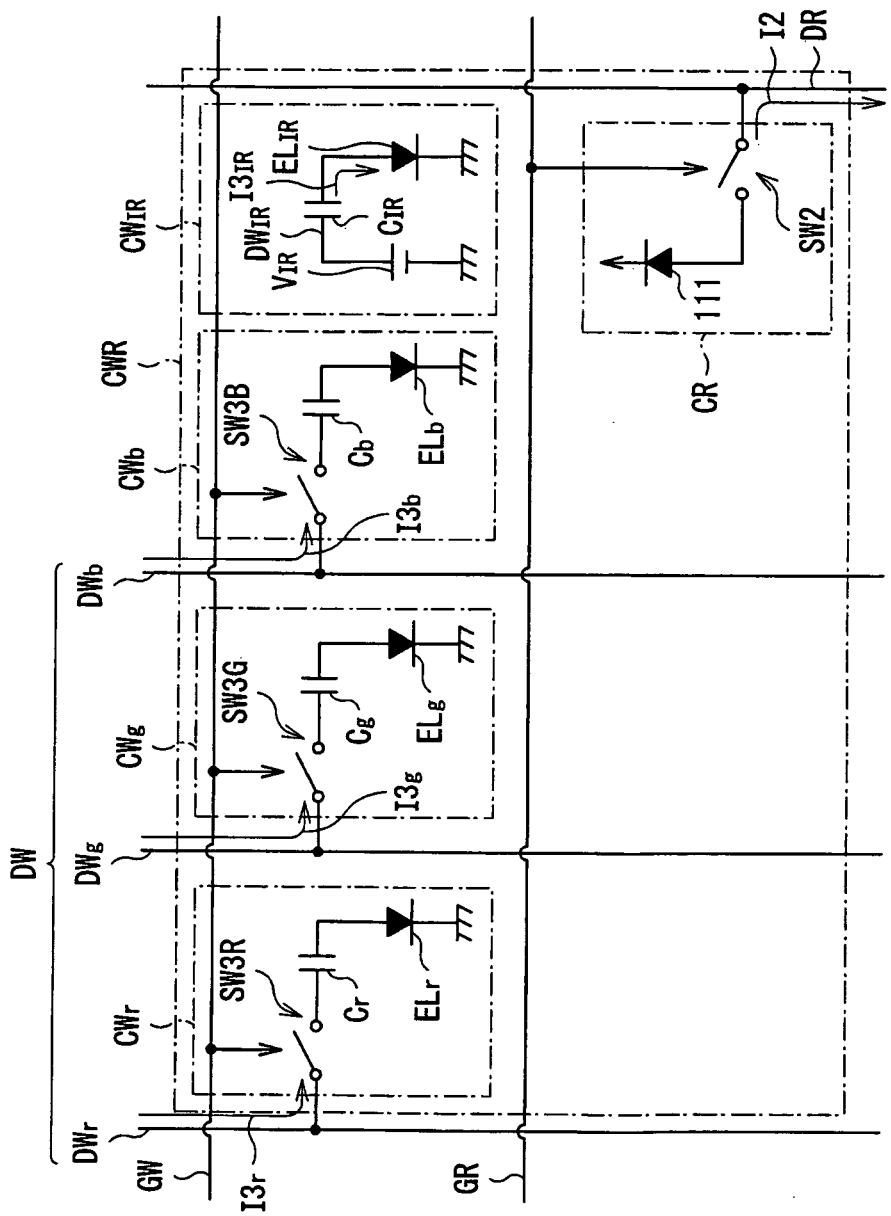
FIG. 16 is a circuit diagram of an example of the structure of the light emitting/receiving cell in FIG. 13.

FIG. 16 shows an example of the circuit structure of the light emitting/receiving cell CWR in each pixel 61, and corresponds to FIG. 5 in the first embodiment. The light emitting/receiving cell CWR has a different structure in each visible light emitting cell CWrgb from the light emitting/receiving cell in each pixel 11 in the first embodiment. More specifically, the red light emitting cell CWr includes the above-described red light-emitting device ELr, a light-emitting device selector switch SW3R disposed in the above-described TFT circuit portion 613R and a capacitor for charge retention Cr. The green light emitting cell CWg includes the above-described green light emitting cell ELg, a light-emitting device selector switch SW3G disposed in the above-described TFT circuit portion 613G and a capacitor for charge retention Cg. The blue light emitting cell CWb includes the above-described blue light-emitting device ELb, a light-emitting device selector switch SW3B disposed in the above-described TFT circuit portion 613B and a capacitor for charge retention Cb. Moreover, the invisible light emitting cell CWIR includes the above-described invisible light-emitting device ELIR, a constant-voltage power supply VIR and a capacitor for charge retention CIR. Each of the light-emitting device selector switches SW3R, SW3G and SW3B includes, for example, a switch device such as a TFT as in the case of the light-emitting device selector switches SW1R, SW1G and SW1B.

The on-off operations of the light-emitting device selector switches SW3R, SW3G and SW3B are controlled by the light emitting gate line GW. Moreover, one end of the light-emitting device selector switch SW3R is connected to the display data supply line DWr, and the other end is connected to one end of the capacitor Cr. The other end of the capacitor Cr is connected to one end (more specifically, the above-described pixel electrode 605A) of the red light-emitting device ELr, and the other end (more specifically, the above-described transparent electrode 605B) of the red light-emitting device ELr is grounded. Likewise, one end of the light-emitting device selector switch SW3G is connected to the display data supply line DWg, and the other end is connected to one end of the capacitor Cg. The other end of the capacitor Cg is connected to one end of the green light-emitting device ELg, and the other end of the green light-emitting device ELg is grounded. One end of the light-emitting device selector switch SW3B is connected to the display data supply line DWb, and the other end is connected to one end of the capacitor Cb. The other end of the capacitor Cb is connected to one end of the blue light-emitting device ELb, and the other end of the blue light-emitting device ELb is grounded. Moreover, one end (more specifically the above-described pixel electrode 605A) of the invisible light-emitting device CLIR is connected to the constant-voltage power supply VIR via the data supply line for invisible light emission DWIR and the capacitor CIR, and the other end (more specifically the above-described transparent electrode 605B) is grounded.

In such a circuit structure, the light emitting/receiving cell CWR according to the embodiment performs the following light emission operation. The light reception operation is the same as that in the first embodiment, and will not be further described.

At first, at the time of emitting the visible light Lrgb, the light-emitting device selector switches SW3R, SW3G and SW3B in one horizontal line are turned on according to a light emission selecting signal supplied from the light emitting gate line GW. A charge is filled in the capacitors Cr, Cg and Cb from the display data supply lines DWr, DWg and DWb via paths I3r, I3g and I3b so that light with an intensity corresponding to each display signal is emitted. Then, the charge filled in the capacitors Cr, Cg and Cb are supplied to the red light-emitting device CLr, the green light-emitting device CLg and the blue light-emitting device CLb so that a current flows, and each of the light-emitting devices emits light with an intensity corresponding to each emitting light color according to each display signal. On the other hand, at the time of emitting the invisible light LIR, a constant voltage is applied to the capacitor CIR from the constant-voltage power supply VIR via the data supply line for invisible light emission DWIR, so a constant current flows into the invisible light-emitting device CLIR via a path I3IR, thereby the invisible light-emitting device CLIR emits the invisible light LIR with a constant intensity.

When neither of the light emission operation nor the light reception operation is performed, the light-emitting device selector switches SW3R, SW3G and SW3B and the light-receiving device selector switch SW2 are in an off state, and the connection between the display data supply line DWr, DWg and DWb and the red light-emitting device ELr, the green light-emitting device ELg or the blue light-emitting device ELb, and the connection between the data read line DR and the light reception sensor 111 are broken.

A method of detecting a target object according to the embodiment is basically the same as the method of detecting a target object according to the first embodiment, except that each light-emitting device to be driven is an organic EL device instead of the liquid crystal device. Therefore, as in the case of the first embodiment shown in FIGS. 6A through 9F, in a normal display state, a light reception signal is obtained in the light-receiving device detection period TF1, so the presence of the target object 12 is detected in a position near the light emitting/receiving cells CWRi(j−1), CWRij and CWRi(j+1).

Figure 17:
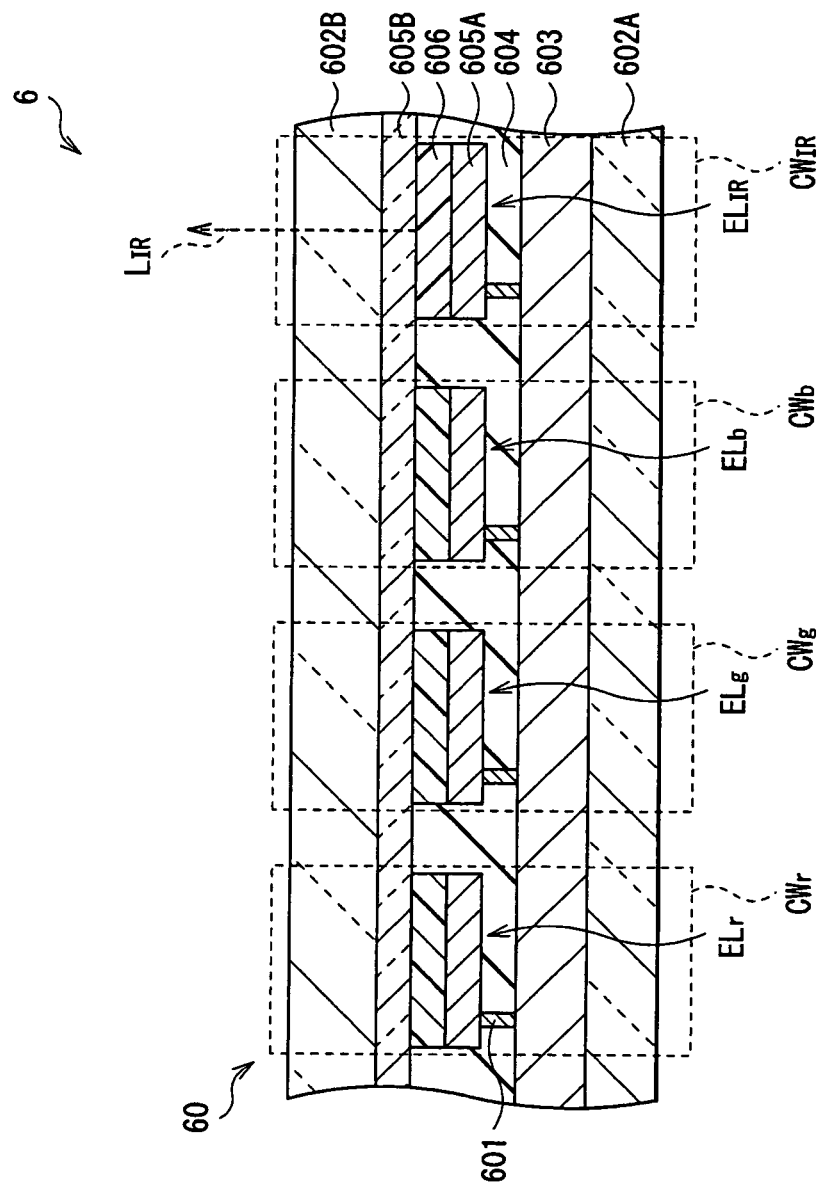
FIG. 17 is a schematic sectional view of an example of the structure of the light emitting/receiving cell in FIG. 13 in a black display state.

Moreover, for example, also in a black display state (a state where the invisible light LIR is emitted only from the invisible light emitting cell CWIR) shown in FIG. 17, as in the case of the first embodiment, the position of the target object 12 is detected through obtaining the light reception signal in the light-receiving device detection period TFm.

As described above, in the embodiment, also in the case where each of the light-emitting devices (the visible light-emitting devices ELr, ELg and ELb and the invisible light-emitting device ELIR) includes an organic EL device which is a self-luminous device, the target object 12 can be reliably detected without influence of use conditions.

Figure 18:
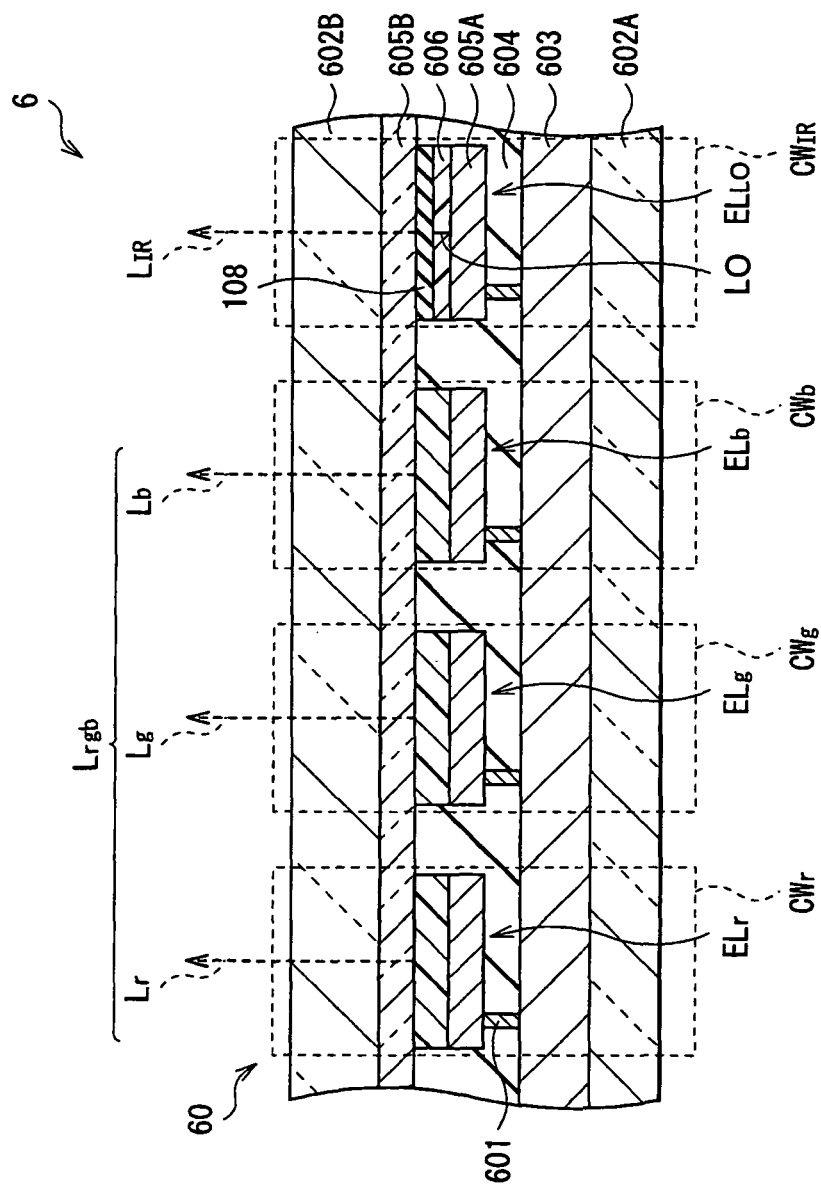
FIG. 18 is a schematic sectional view of another example of the light emitting/receiving cell in FIG. 13.
Figure 19:
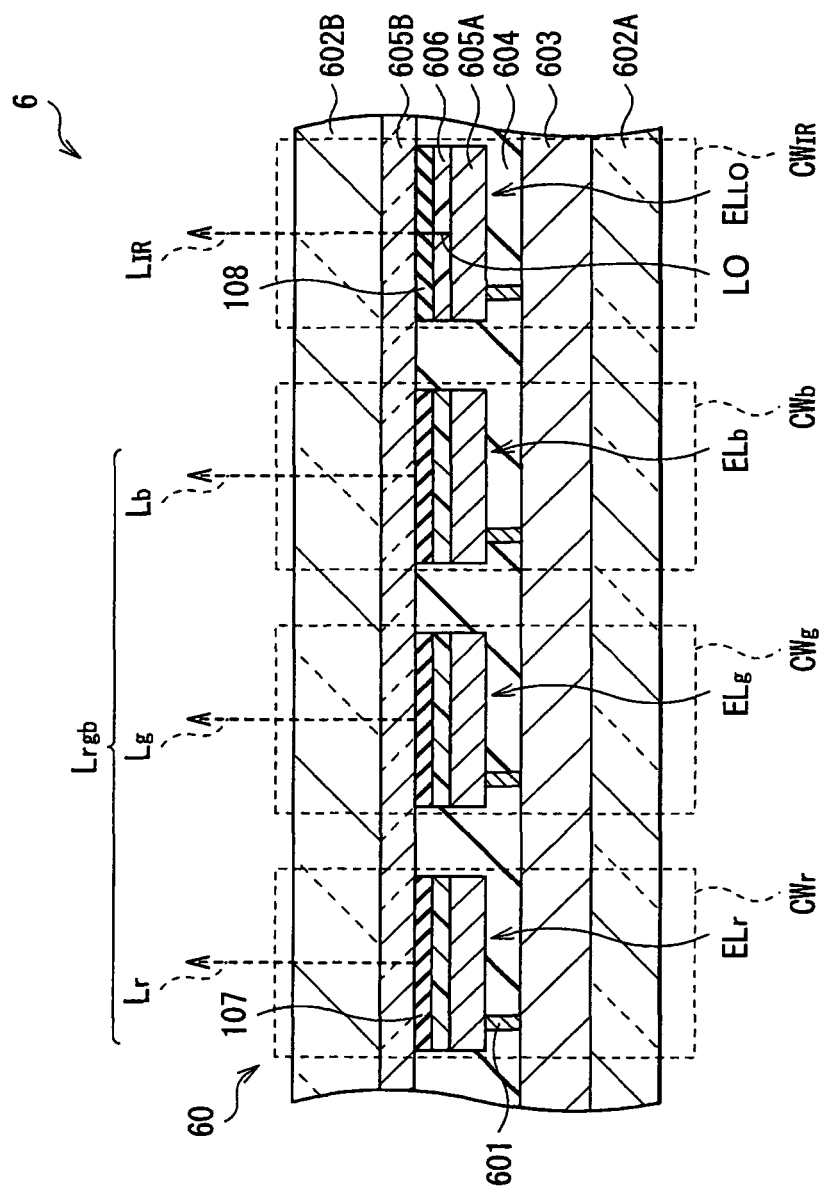
FIG. 19 is a schematic sectional view of another example of the structure of the light emitting/receiving cell in FIG. 13.

For example, as shown in FIG. 18, the invisible light emitting cell CWIR may include a combination of a white light-emitting device ELL0 and the above-described selection filter 108 instead of the invisible light-emitting device ELIR. Herein, the white light-emitting device ELL0 corresponds to a specific example of "a white light emitting organic EL device" in the invention, and the invisible light emitting cell CWIR in this case corresponds to a specific example of "a white light emission layer" in the invention. Even in such a structure, the invisible light LIR can be emitted from the invisible light emitting cell CWIR. Moreover, for example, as shown in FIG. 19, the above-described color filter 107 may be disposed in each visible light emitting cell CWrgb. In such a structure, the color purity of the visible light Lrgb emitted from each of the visible light-emitting devices ELr, ELg and ELb can be improved.

Figure 20:
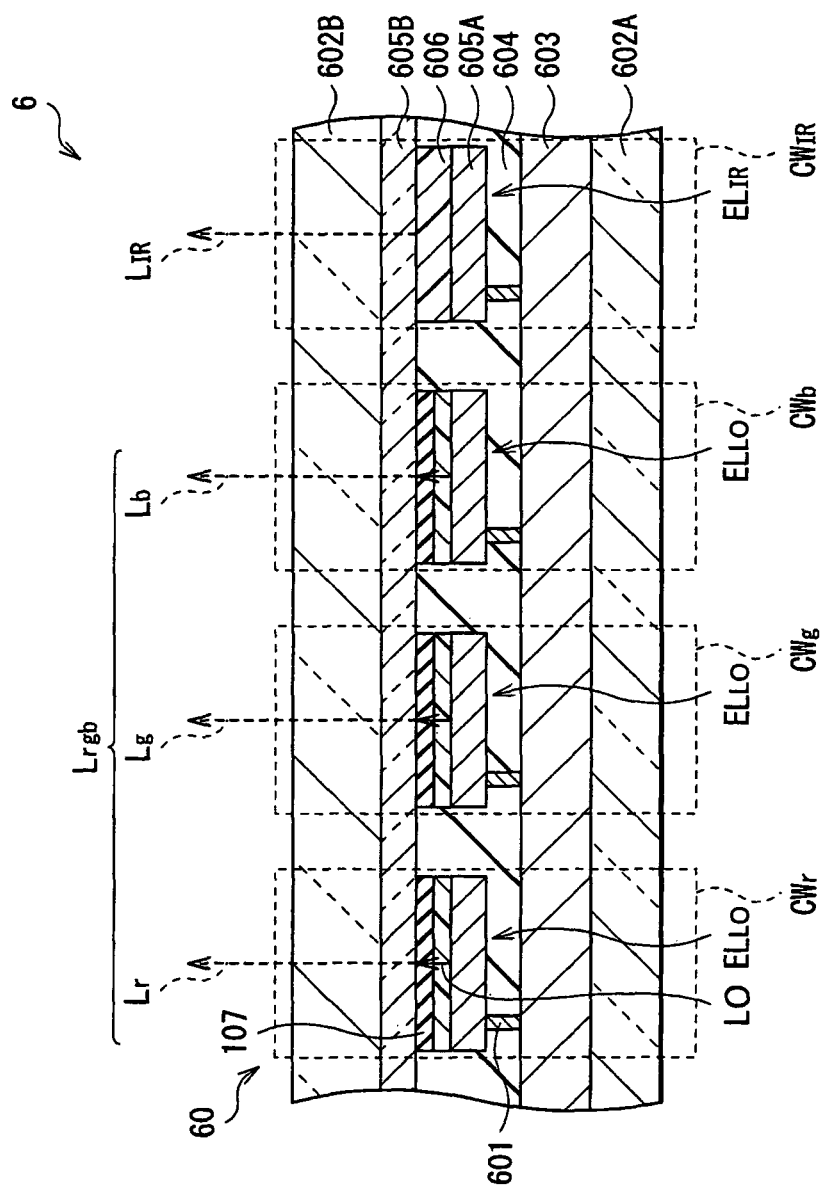
FIG. 20 is a schematic sectional view of another example of the structure of the light emitting/receiving cell in FIG. 13.
Figure 21:
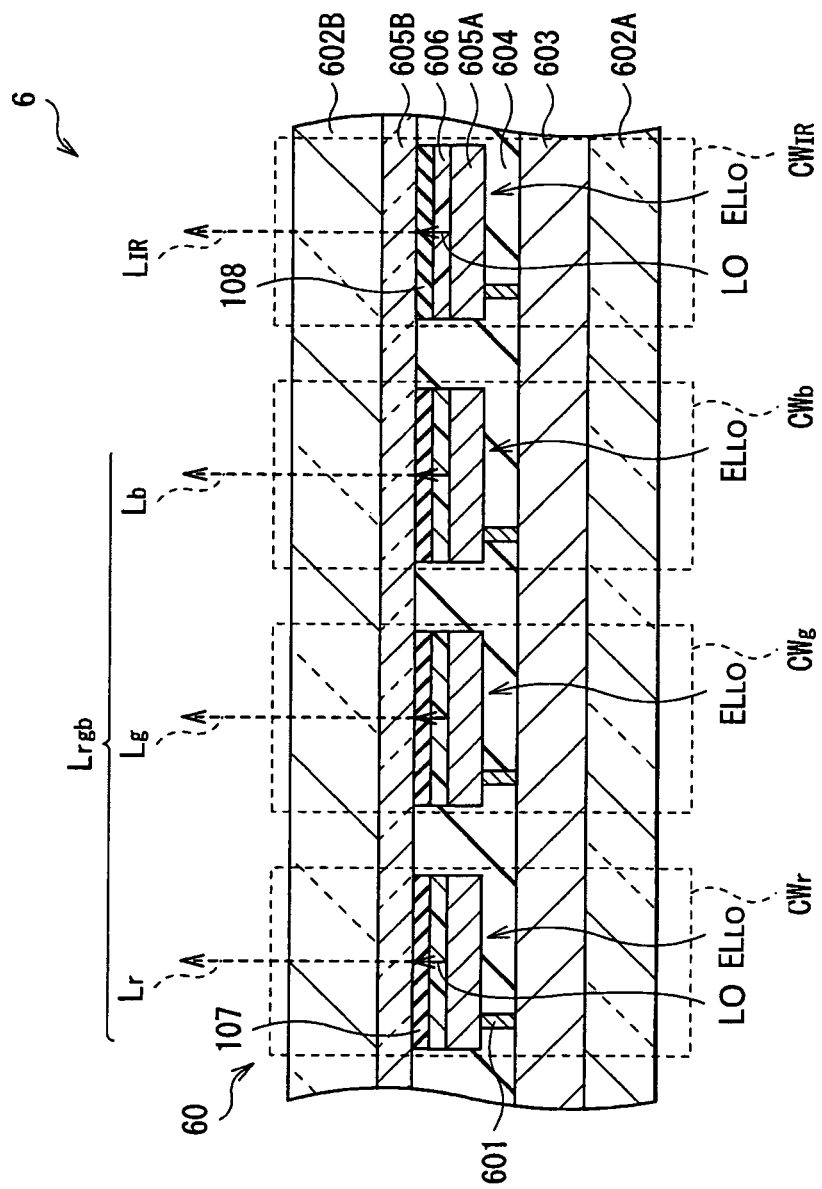
FIG. 21 a schematic sectional view of another example of the structure of the light emitting/receiving cell in FIG. 13.

For example, as shown in FIG. 20, each visible light emitting cell CWrgb may include a combination of the white light-emitting device ELL0 and the color filter 107, or for example, as shown in FIG. 21, each of the invisible light emitting cell CWIR and the visible light emitting cells CWrgb may include a combination of the white light-emitting device ELL0 and the selection filter 108 or the color filter 107. In such a structure, each visible light Lrgb can be emitted from each visible light emitting cell CWrgb, and the invisible light LIR can be emitted from the invisible light emitting cell CWIR.

In the embodiment, as an example of the self-luminous device, the case where each of the light-emitting devices (the red light-emitting device CLr, the green light-emitting device CLg, the blue light-emitting device CLb and the invisible light-emitting device CLIR) includes an organic EL device is described; however, any other self-luminous device, for example, a light emitting diode (LED) may be included.

Moreover, in the embodiment, as in the case of the first embodiment, the arrangement or the structure of each light emitting/receiving cell CWR can be freely set, and various light emission drives or various light reception drives can be performed.

[Third Embodiment]

Next, a third embodiment of the invention will be described below.

In the first embodiment and the second embodiment, the case where the invisible light-emitting device and the invisible (and visible) light-receiving device (the invisible light-emitting device CLIR and the light reception sensor 111) are separately included is described; however, in the embodiment, the case where a single device (an invisible light-emitting device ELIR) including such an invisible light-emitting device and such a invisible (and visible) light-receiving device will be described below.

Figure 22:
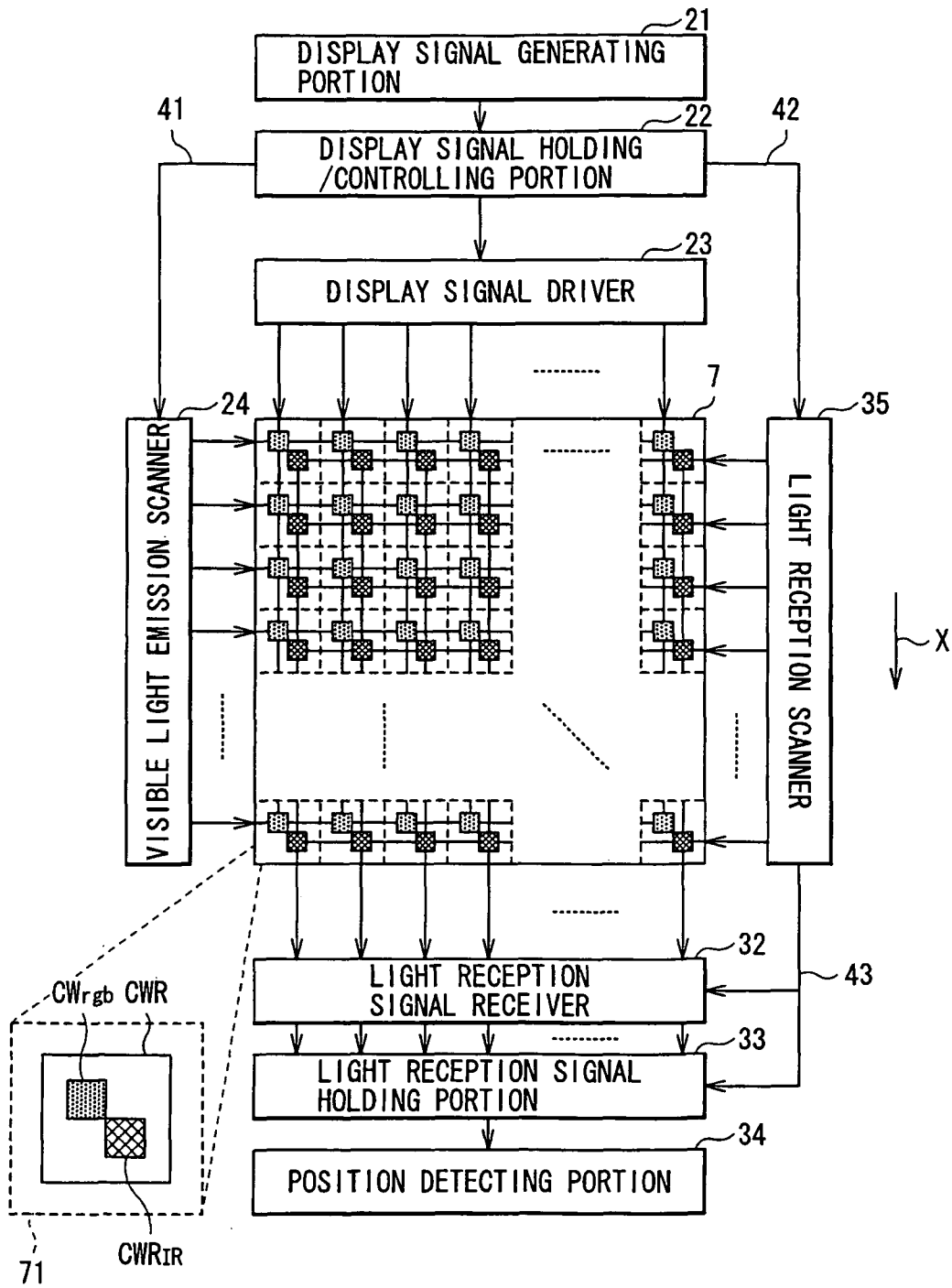
FIG. 22 a block diagram of the whole structure of an image display unit according to a third embodiment of the invention.

FIG. 22 shows the whole structure of an image display unit according to the embodiment. In this drawing, like components are denoted by like numerals as of the image display unit according to the first embodiment shown in FIG. 1 and the image display unit according to the second embodiment shown in FIG. 13, and will not be further described. The image display unit includes a display portion 7 instead of the display portion 1 or 6 in the first or second embodiment shown in FIG. 1 or 13, and a light reception signal selector scanner 35 instead of the light reception scanner 31. The display signal driver 23 and the visible light emission scanner 24 in the embodiment correspond to specific examples of "a third light emission driving means", and the light reception signal selector scanner 35 corresponds to a specific example of "a fourth light emission driving means" and "a second light reception driving means" in the invention.

As in the case of the display portions 1 and 6, in the display portion 7, a plurality of pixels 71 are arranged on the whole surface of the display portion 7 in a matrix form, and the display portion 7 displays an image such as a predetermined graphic form or character while performing line-sequential operation. The pixel 71 is distinguished from the pixel in the display portions 1 and 6 by the fact that the light emitting/receiving cell CWR includes a visible light emitting cell CWrgb emitting visible light and an invisible light emitting/receiving cell CWRIR emitting invisible light and receiving invisible light (and visible light). In other words, the invisible light emitting/receiving cell CWRIR has functions of the visible light emitting cell CWIR and the light receiving cell CR in the display portions 1 and 6.

The light reception signal selector scanner 35 switches between the light emission operation and the light reception operation of the invisible light emitting/receiving cell CWRIR according to the light reception timing control signal 42 outputted from the display signal holding/controlling portion 22 so as to select a target invisible light emitting/receiving cell CWRIR to be driven for light reception. As will be described in detail later, the light reception signal selector scanner 35 supplies a switch signal via a selector line S connected to each pixel 71 of the display portion 7, and as in the case of the light reception scanner 31, the light reception signal selector scanner 35 outputs the light reception block control signal 43 to the light reception signal receiver 32 and the light reception signal holding portion 33. Therefore, the light reception signal selector scanner 35 also plays a role in controlling the operation of a portion contributing the light reception operation.

Figure 23:
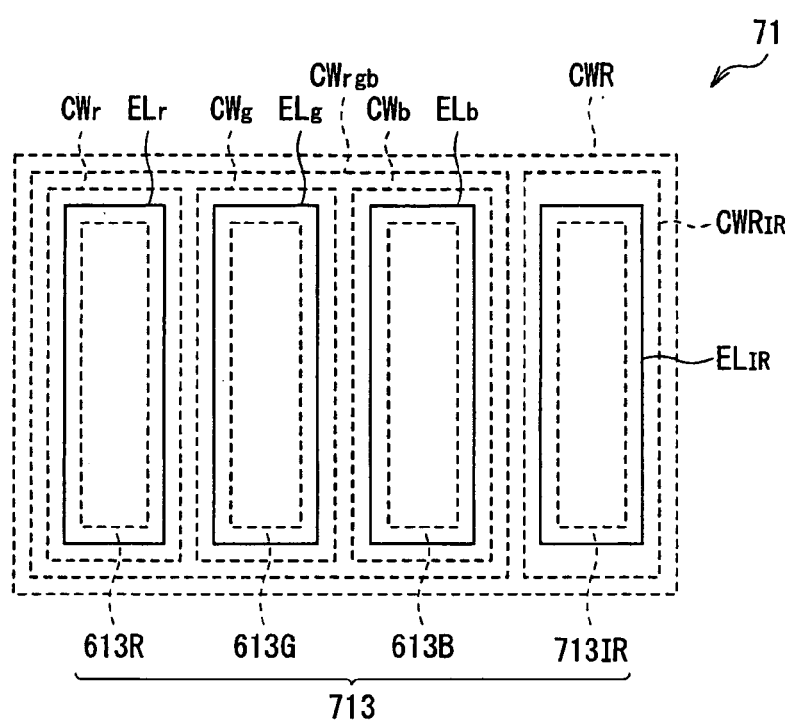
FIG. 23 is a schematic plan view of an example of the structure of a light emitting/receiving cell in FIG. 22.

FIG. 23 shows a plan view of an example of the structure of the light emitting/receiving cell CWR in each pixel 71, and corresponds to FIG. 2 in the first embodiment and FIG. 14 in the second embodiment. The light emitting/receiving cell CWR in the embodiment includes the visible light emitting cell CWrgb and the invisible light emitting/receiving cell CWRIR as described above. The invisible light emitting/receiving cell CWRIR includes an invisible light-emitting device ELIR which is a portion emitting invisible light and receiving invisible light (and visible light). The invisible light emitting cell CWIR includes the invisible light-emitting device ELIR which is a portion emitting invisible light and a TFT circuit portion 713IR including a capacity device (a capacitor CIR) which supplies a charge to the invisible light-emitting device ELIR. As will be described later, the invisible light-emitting device ELIR can receive invisible light (and visible light) by the application of a reverse bias voltage. Moreover, the red light-emitting device ELr, the green light-emitting device ELg and the blue light-emitting device ELb in this case correspond to specific examples of "third light-emitting devices" in the invention, and the invisible light-emitting device ELIR in this case corresponds to a specific example of "a light-emitting/receiving device" in the invention.

Figure 24:
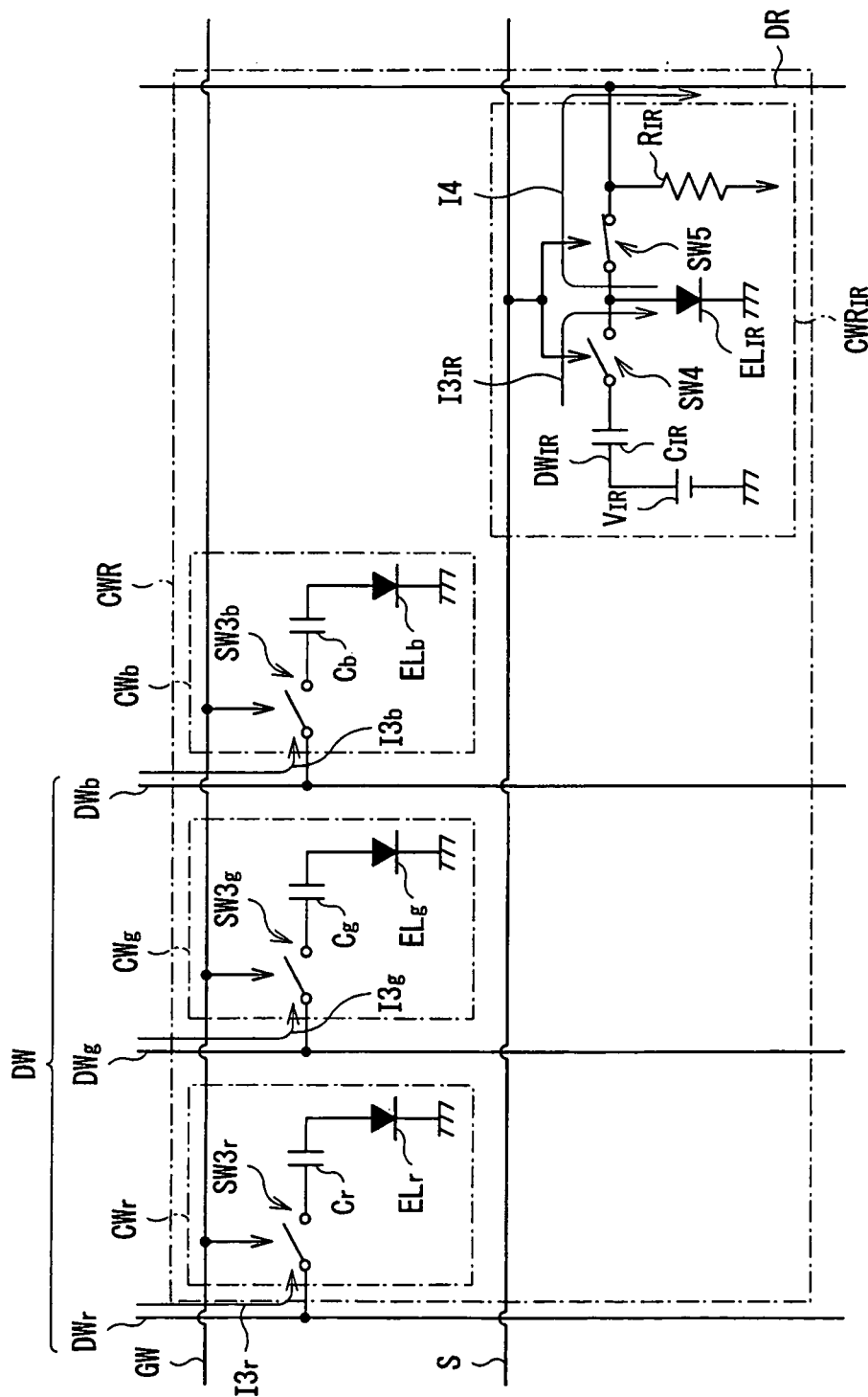
FIG. 24 is a circuit diagram of an example of the structure of the light emitting/receiving cell in FIG. 22.

FIG. 24 shows an example of the circuit structure of the light emitting/receiving cell CWR in each pixel 71, and corresponds to FIG. 5 in the first embodiment and FIG. 16 in the second embodiment. The light emitting/receiving cell CWR in the third embodiment is distinguished from the light emitting/receiving cell in each pixel 61 in the second embodiment by the fact that the invisible light emitting/receiving cell CWRIR is included instead of the invisible light emitting cell CWIR and the light receiving cell CR. The invisible light emitting/receiving cell CWRIR includes the above-described invisible light-emitting device ELIR, the constant-voltage power supply VIR, the capacitor for charge retention CIR, selector switches SW4 and SW5 switching between the light emission operation and the light reception operation and a resistor RIR. Each of the selector switches SW4 and SW5 includes, for example, a switch device such as a TFT as in the case of the light-emitting device selector switches SW1R, SW1G and SW1B.

The on-off operations of the light-emitting device selector switches SW4 and SW5 are controlled by the selector line S. Moreover, one end (more specifically the above-described pixel electrode 605A) of the invisible light-emitting device CLIR is connected to the constant-voltage power supply VIR via the data supply line for invisible light emission DWIR, the selector switch SW4 and the capacitor CIR, and the other end (more specifically, the above-described transparent electrode 605B) is grounded. Further, one end of the invisible light-emitting device CLIR is also connected to one end of the resistor RIR and the data read line DR via the selector switch SW5, and the other end of the resistor RIR is grounded or connected to a positive bias point (not shown).

In such a circuit structure, in the light emitting/receiving cell CWR in the embodiment, the invisible light emitting/receiving cell CWRIR performs the following invisible light emission operation and the following invisible (and visible) light reception operation. The visible light emission operation in each of the visible light emitting cells CWr, CWg and CWb is the same as that in the second embodiment, and will not be further described.

At first, at the time of emitting the invisible light LIR, while the selector switches SW4 in one horizontal line are turned on according to a switch signal supplied from the selector line S, the selector switches SW5 in one horizontal line are turned off. Therefore, as in the case of the second embodiment, a constant voltage is applied to the capacitor CIR from the constant-voltage power supply VIR via the data supply line for invisible light emission DWIR, and a constant current flows into the invisible light-emitting device CLIR through a path I3IR, thereby the invisible light-emitting device CLIR emits the invisible light LIR with a constant intensity.

On the other hand, at the time of receiving the invisible light LIR (and the visible light Lrgb), while the selector switches SW4 in one horizontal line are turned off according to the switch signal supplied from the selector line S, the selector switches SW5 in one horizontal line are turned on. Moreover, at this time, a reverse bias voltage is applied to the invisible light-emitting device ELIR. For example, an organic EL device, a LED device or the like has a property of emitting light when a forward bias voltage is applied, and a property of generating a current through receiving light when the reverse bias voltage is applied. Therefore, the selector switch SW4 is in an off state, and the selector switch SW5 is in an on state, and when the reverse bias voltage is applied to the invisible light-emitting device ELIR, a current according to the amount of light received in the invisible light-emitting device ELIR is supplied to the data read line DR through a path I4, thereby the invisible light LIR (and the visible light Lrgb) is received. The resistor RIR generates a potential difference between both ends of the data read line DR on the basis of the current supplied to the data read line DR via the path I4, and outputs the potential difference as a light reception signal.

When neither the light emission operation nor the light reception operation is performed, both of the selector switches SW4 and SW5 are turned off, and the connection between the data supply line for invisible light emission DWIR and the invisible light-emitting device ELIR and the connection between the data read line DR and the invisible light-emitting device ELIR are broken.

A process of detecting a target object in a normal display state and a black display state in the image display unit according to the embodiment is basically the same as that in the first embodiment and the second embodiment, except that the invisible light emitting/receiving cell CRIR has the functions of the visible light emitting cell CWIR and the light receiving cell CR so that the invisible light emission operation and the invisible (and visible) light reception operation are not performed in the same pixel.

Figure 25A:
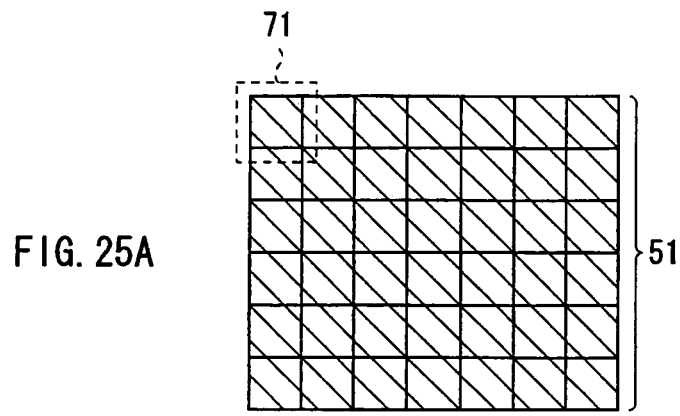
FIGS. 25A, 25B and 25C are schematic views of an example of a process of detecting a target object in a normal display state by line-sequential operation.
Figure 25B:
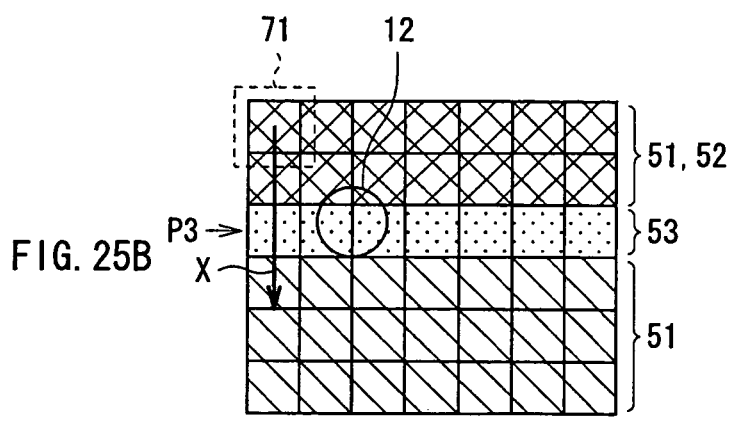
Figure 25C:
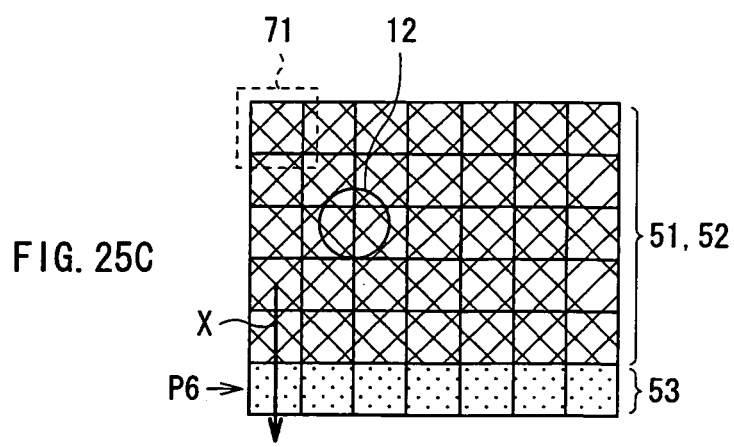

More specifically, for example, as shown in FIGS. 25A through 25C, in the normal display state, compared to the case of FIGS. 6A through 6C described in the first embodiment, the invisible light emitting range 51 and the light receiving range 53 are not applied to the same pixel. Except for this, the process is the same as that in the first embodiment and the second embodiment. In other words, one horizontal line performs line-sequential light emission operation in an arrow X direction, and receives reflected light of emitted visible light Lrgb or emitted invisible light LIR in line sequence, so the whole display portion 7 becomes an light emitting range as well as a light receiving range, thereby image data is displayed throughout the display portion 7, and whether or not to locate the target object 12 near the display portion 7, and if so, the position of the target object 12 are detected on the basis of the light reception signal detected by the light reception operation of the invisible light-emitting device ELIR.

Figure 26A:
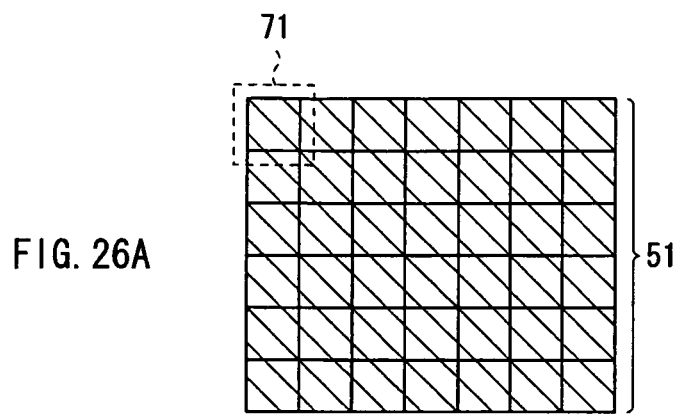
FIGS. 26A, 26B and 26C are schematic views of an example of a process of detecting a target object in a black display state by line-sequential operation.
Figure 26B:
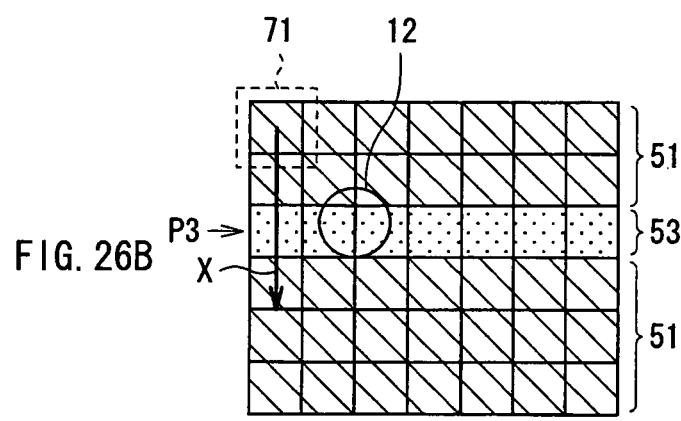
Figure 26C:
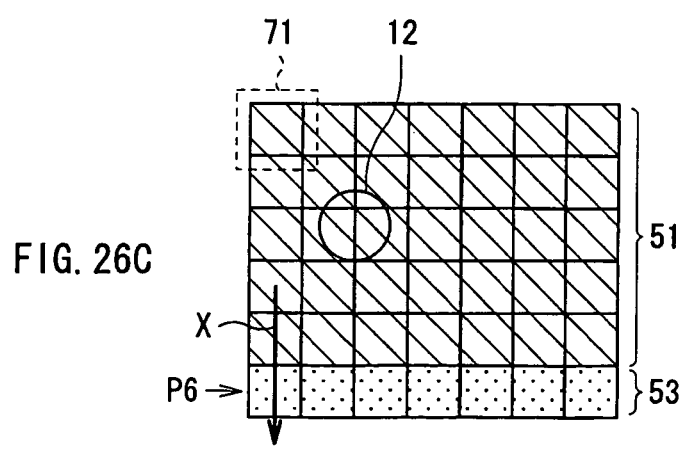

On the other hand, as shown in FIGS. 26A through 26C, also in the case of the black display state, compared to the case of FIGS. 8A through 8C described in the first embodiment, the same operation is performed, except that the invisible light emitting range 51 and the light receiving range 53 are not applied to the same pixel. In other words, as in the case of the normal display state, in the black display state, the position of the target object 12 is detected through the use of the invisible light LIR emitted from the invisible wavelength range 51. Thus, the target object 12 is detected without influence of the display state of the display portion 7, that is, a change in intensity according to image data and influence of use conditions such as surrounding circumstances (the case where it is bright or dark).

Moreover, the basic operation of a method of driving the image display unit according to the embodiment in the normal display state and the black display state is the same as that in the first embodiment and the second embodiment. Therefore, the light reception signal is obtained in the light-receiving device detection periods TF1 and TFm, so the presence of the target object 12 is detected in a position near the light emitting/receiving cell CWRi(j−1), CWRij and CWRi(j+1).

As described above, in the embodiment, the invisible light-emitting device and the invisible (and visible) light-receiving device are combined into a single device (the invisible light-emitting device EL IR), and the single device emits invisible light and receives invisible light (and visible light) by a time-sharing system, so in addition to the effects in the first embodiment and the second embodiment, the structure of the light emitting/receiving cell CWR can be simplified, and the circuit structure and the wiring structure of the display portion 7 can be simplified.

In the embodiment, the case where the invisible light-emitting/receiving device (the invisible light-emitting device ELIR) in the invisible light emitting/receiving cell CWRIR includes an organic EL device is described; however, any other device having a function of emitting invisible light and a function of receiving invisible light, for example, a light emitting diode or the like may be included.

Moreover, in the embodiment, the case where the invisible light-emitting device ELIR receives invisible light and visible light is described; however, for example, as in the case of the first embodiment and the second embodiment, the selection filter 108 may be disposed in a region corresponding to the invisible light emitting cell CWRIR so that the invisible light-emitting device ELIR receives only invisible light.

Moreover, in the embodiment, as in the case of the first embodiment and the second embodiment, the arrangement and the structure of each light emitting/receiving cell CWR can be freely set, and various light emission drives or various light reception drives can be performed.

Although the present invention is described referring to the first embodiment, the second embodiment and the third embodiment, the invention is not specifically limited to them, and can be variously modified.

For example, in the above embodiments, the position of the target object 12 on the display portion 1, 6 or 7 is detected on the basis of the received light reception signal is described; however, at least one of the position and the size of the target object 12 may be detected on the basis of the light reception signal, and a plurality of target objects arranged at the same time can be detected.

Moreover, in the above embodiments, the case where the invisible light-emitting device CLIR emits the invisible light LIR with a constant intensity is described; however, the invisible light-emitting device CLIR may emit, for example, light with an intensity having a pulse waveform which has a predetermined period instead of a constant intensity. In such a structure, in addition to the effects in the above embodiments, the power consumption can be reduced.

In the above embodiments, the case where the invisible light LIR is light in a range (a near-infrared and infrared range) on a longer wavelength side than the visible wavelength range is described; however, the invisible light LIR may be light in a range (an ultraviolet range) on a shorter wavelength side than the visible wavelength range.

In the above embodiments, the case where the visible light Lrgb and the invisible light LIR are independently emitted from separate light-emitting devices is described; however, the visible light Lrgb and the invisible light LIR may be emitted from a single light-emitting device by a time-sharing system. In such a structure, the circuit structure can be simplified, and the power consumption can be reduced.

In the above embodiments, the case where the pixels 11, 61 and 71 (including the light-emitting devices and the light-receiving device) of the display portions 1, 6 and 7 are arranged in a matrix form, and line-sequential operation is performed in the display portions 1, 6 and 7 is described; however, the arrangement of each pixel (the light-emitting devices and the light-receiving device) and the method of operating each pixel is not specifically limited to the case, and for example, each pixel (the light-emitting devices and the light-receiving device) may be arranged in a predetermined segment form.

It should be understood by those skilled in the art that various modifications, combinations, sub-combinations and alterations may occur depending on design requirements and other factors insofar as they are within the scope of the appended claims or the equivalents thereof.

What is claimed is:

1. An image display unit comprising:
a light source that emits a light;
a pair of transparent substrates;
a liquid crystal layer disposed between the pair of transparent substrates;
a transmission layer that includes first and second filters, the first filter configured to transmit a first light from the light and a second filter configured to transmit a second light from the light;
a plurality of pixels, each pixel including a first sub-pixel element that modulates the first light to a visible wavelength range based on image data, a second sub-pixel element that modulates the second light to an invisible wavelength range,
and a third sub-pixel element that receives reflected light, the reflected light being the second light that is reflected from a target object;
a display driving means for driving the first sub-pixel element of the plurality of pixels based on the image data to emit the first light in the visible wavelength range;
a light reception driving means for driving the second sub-pixel element of the plurality of pixels to receive the reflected light; and
a detecting means for detecting the target object based on the reflected light.

2. The image display unit according to claim 1, wherein the transmission of the light by the first and second filters is based on a predetermined wavelength range that includes a red wavelength range, a green wavelength range, a blue wavelength range, and an infrared wavelength range.

3. The image display unit according to claim 1, wherein the second light is infrared light.

4. The image display unit according to claim 1, wherein the detection means detects a position or a size of the target object.

5. The image display unit according to claim 1, wherein the detection means detects a plurality of target objects based on the reflected light.

6. The image display unit according to claim 1, wherein the plurality of pixels are arranged in a matrix form,
the display driving means drives the first sub-pixel elements according to a line-sequential display operation, and
the light reception driving means drives the second sub-pixel elements according to a line-sequential light reception operation.

7. The image display unit according to claim 6, wherein the light reception driving means drives the second sub-pixel elements according to the line-sequential light reception operation in synchronization with the line-sequential display operation.

8. The image display unit according to claim 1, wherein the plurality of the second sub-pixel elements are configured to receive a
second reflected light, the second reflected being the first light that is reflected from the target object, and
the light reception driving means drives each second sub-pixel element of the plurality of pixels to receive the second reflected light.

9. The image display unit according to claim 8, wherein each second sub-pixel element includes first and second light-receiving portions, and
the light reception driving means drives the first light-receiving portion to detect the reflected light and the second light-receiving portion to detect the second reflected light.

10. The image display unit according to claim 9, wherein the light reception driving means selectively switches between the first and second light-receiving portions of each second sub-pixel element.

11. The image display unit according to claim 1, wherein the plurality of pixels each include a silicon-based material.

12. An image display unit comprising:
a light source that emits a light;
a pair of transparent substrates;
a liquid crystal layer disposed between the pair of transparent substrates;
a transmission layer that includes first and second filters, the first filter configured to transmit a first light from the light and a second filter configured to transmit a second light from the light;
a plurality of pixels, each pixel including a first sub-pixel element that modulates the first light to a visible wavelength range based on image data, a second sub-pixel element that modulates the second light to an invisible wavelength range, and a third sub-pixel element that receives reflected light, the reflected light being the second light that is reflected from a target object;
a display driving unit configured to drive each first sub-pixel element of the plurality of pixels based on the image data to emit the first light in the visible wavelength range;
a light reception driving unit configured to drive each second sub-pixel element of the plurality of pixels to receive the reflected light; and
a detecting unit configured to detect the target object based on the reflected light.

13. The image display unit according to claim 12, wherein the transmission of the light by the first and second filters is based on a predetermined wavelength range that includes a red wavelength range, a green wavelength range, a blue wavelength range, and an infrared wavelength range.

14. The image display unit according to claim 12, wherein the second light is infrared light.

15. The image display unit according to claim 12, wherein the detection unit detects a position or a size of the target object.

16. The image display unit according to claim 12, wherein the detection unit detects a plurality of target objects based on the reflected light.

17. The image display unit according to claim 12, wherein the plurality of pixels are arranged in a matrix form,
the display driving unit drives the first sub-pixel elements according to a line-sequential display operation, and the light reception driving unit drives the second sub-pixel elements according to a line-sequential light reception operation.

18. The image display unit according to claim 12, wherein the light reception driving unit drives the second sub-pixel elements according to the line-sequential light reception operation in synchronization with the line-sequential display operation.

19. The image display unit according to claim 12, wherein the plurality of the second sub-pixel elements are configured to receive a second reflected light, the second reflected being the first light that is reflected from the target object, and
the light reception driving unit is configured to drive each second sub-pixel element of the plurality of pixels to receive the second reflected light.

20. The image display unit according to claim 19, wherein each second sub-pixel element includes first and second light-receiving portions, and
the light reception driving unit is configured to drive the first light-receiving portion to detect the reflected light and the second light-receiving portion to detect the second reflected light.

21. The image display unit according to claim 20, wherein the light reception driving unit is configured to selectively switch between the first and second light-receiving portions of each second sub-pixel element.

22. The image display unit according to claim 12, wherein the plurality of pixels each include a silicon-based material.

* * * * *